US011424260B2

(12) United States Patent
Lai et al.

(10) Patent No.: US 11,424,260 B2
(45) Date of Patent: Aug. 23, 2022

(54) ARRAY OF PILLARS LOCATED IN A UNIFORM PATTERN

(71) Applicant: MACRONIX INTERNATIONAL CO., LTD., Hsinchu (TW)

(72) Inventors: Erh-Kun Lai, Tarrytown, NY (US); Hsiang-Lan Lung, Ardsley, NY (US)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 28 days.

(21) Appl. No.: 17/198,080

(22) Filed: Mar. 10, 2021

(65) Prior Publication Data

US 2021/0193673 A1  Jun. 24, 2021

Related U.S. Application Data

(62) Division of application No. 16/384,421, filed on Apr. 15, 2019, now Pat. No. 11,037,947.

(51) Int. Cl.
*H01L 27/1157* (2017.01)
*H01L 21/768* (2006.01)
(Continued)

(52) U.S. Cl.
CPC ...... *H01L 27/11565* (2013.01); *H01L 21/764* (2013.01); *H01L 21/76805* (2013.01);
(Continued)

(58) Field of Classification Search
CPC .......... H01L 21/76805; H01L 27/1157; H01L 27/11565; H01L 21/764; H01L 21/76895;
(Continued)

(56) References Cited

U.S. PATENT DOCUMENTS 6,906,940 B1  6/2005 Lue
6,933,556 B2  8/2005 Endoh
(Continued)

FOREIGN PATENT DOCUMENTS

CN  109300907 A  2/2019
EP  2048709 A2  4/2009
(Continued)

OTHER PUBLICATIONS

Bae, JH, "Samsung's 3D V-NAND breaks through chip scaling limits", http://itersnews.com, dated Feb. 14, 2014, 5 pages.
(Continued)

*Primary Examiner* — Shahed Ahmed
*Assistant Examiner* — Khatib A Rahman
(74) *Attorney, Agent, or Firm* — Andrew L. Dunlap; Haynes Beffel & Wolfeld LLP

(57) ABSTRACT

A memory device comprises a stack of conductive layers, and an array of pillars through the stack. Each of the pillars comprises a plurality of series-connected memory cells located in a layout pattern of pillar locations at cross-points between the pillars and the conductive layers. The pillars in the array are arranged in a set of rows of pillars extending in a first direction. First and second source lines are disposed vertically through the pillars of first and second particular rows of pillars. The set of rows of pillars includes a subset of rows of pillars including multiple members disposed between the first source line and the second source line. A source line conductor is disposed beneath and electrically connected to the first source line, the second source line, and the subset of rows of pillars disposed between the first and second source lines.

10 Claims, 24 Drawing Sheets

(51) Int. Cl.
- *H01L 27/11578* (2017.01)
- *H01L 27/11582* (2017.01)
- *H01L 27/11565* (2017.01)
- *H01L 21/764* (2006.01)
- *H01L 23/535* (2006.01)
- *H01L 29/06* (2006.01)

(52) U.S. Cl.
CPC ...... *H01L 21/76895* (2013.01); *H01L 23/535* (2013.01); *H01L 27/1157* (2013.01); *H01L 27/11582* (2013.01); *H01L 29/0649* (2013.01)

(58) Field of Classification Search
CPC ............ H01L 23/535; H01L 27/11582; H01L 29/0649; H01L 27/11578; H01L 27/11563; H01L 27/11568
See application file for complete search history.

(56) References Cited

U.S. PATENT DOCUMENTS

| | | |
|---|---|---|
| 7,315,474 B2 | 1/2008 | Lue |
| 7,420,242 B2 | 9/2008 | Lung |
| 7,696,559 B2 | 4/2010 | Arai et al. |
| 7,851,849 B2 | 12/2010 | Kiyotoshi |
| 8,008,732 B2 | 8/2011 | Kiyotoshi et al. |
| 8,154,068 B2 | 4/2012 | Katsumata et al. |
| 8,274,108 B2 | 9/2012 | Katsumata et al. |
| 8,363,476 B2 | 1/2013 | Lue et al. |
| 8,467,219 B2 | 6/2013 | Lue |
| 8,503,213 B2 | 8/2013 | Chen et al. |
| 8,648,438 B2 | 2/2014 | Cai et al. |
| 8,759,899 B1 | 6/2014 | Lue et al. |
| 8,803,222 B2* | 8/2014 | Lee .................. H01L 27/11551 257/E29.262 |
| 8,853,818 B2 | 10/2014 | Lue |
| 8,921,918 B2* | 12/2014 | Shim ................ H01L 27/11578 257/324 |
| 8,993,429 B2 | 3/2015 | Chen |
| 9,219,073 B2 | 7/2015 | Chen |
| 9,147,468 B1 | 9/2015 | Lue |
| 9,218,874 B1* | 12/2015 | Koh .................. G11C 11/5671 |
| 9,219,070 B2* | 12/2015 | Thimmegowda ... H01L 27/0207 |
| 9,219,074 B2 | 12/2015 | Chen |
| 9,219,168 B2* | 12/2015 | Seol .................. G11C 16/0483 |
| 9,373,632 B2 | 6/2016 | Chen |
| 9,391,084 B2 | 7/2016 | Lue |
| 9,437,605 B2 | 9/2016 | Chen |
| 9,455,267 B2 | 9/2016 | Zhang |
| 9,502,349 B2 | 11/2016 | Chen |
| 9,524,980 B2 | 12/2016 | Lue |
| 9,536,970 B2* | 1/2017 | Seol .................. H01L 29/42348 |
| 9,666,532 B2 | 5/2017 | Chen |
| 9,679,849 B1 | 6/2017 | Chen |
| 9,698,156 B2 | 7/2017 | Lue |
| 11,037,947 B2 | 6/2021 | Lai et al. |
| 2005/0280061 A1 | 12/2005 | Lee |
| 2007/0045708 A1 | 3/2007 | Lung |
| 2007/0158736 A1 | 7/2007 | Arai et al. |
| 2007/0252201 A1 | 11/2007 | Kito et al. |
| 2008/0073635 A1 | 3/2008 | Kiyotoshi et al. |
| 2008/0175032 A1 | 7/2008 | Tanaka et al. |
| 2008/0180994 A1 | 7/2008 | Katsumata et al. |
| 2009/0097321 A1 | 4/2009 | Kim et al. |
| 2009/0184360 A1 | 7/2009 | Jin et al. |
| 2009/0296476 A1* | 12/2009 | Shin .................. G11C 5/02 365/185.17 |
| 2010/0270593 A1 | 10/2010 | Lung et al. |
| 2011/0018051 A1 | 1/2011 | Kim et al. |
| 2012/0007167 A1 | 1/2012 | Hung et al. |
| 2012/0068241 A1 | 3/2012 | Sakuma et al. |
| 2012/0119283 A1 | 5/2012 | Lee et al. |
| 2012/0182806 A1 | 7/2012 | Chen et al. |
| 2012/0182807 A1* | 7/2012 | Lue .................. H01L 27/11556 365/185.18 |
| 2013/0248974 A1* | 9/2013 | Alsmeier .............. H01L 29/788 257/321 |
| 2014/0140131 A1* | 5/2014 | Yeh .................... G11C 16/0483 365/185.05 |
| 2015/0105639 A1 | 4/2015 | Watanabe |
| 2015/0206896 A1* | 7/2015 | Chen ................ H01L 27/11565 257/314 |
| 2015/0206898 A1* | 7/2015 | Chen .................. H01L 27/0207 257/324 |
| 2015/0206899 A1 | 7/2015 | Chen |
| 2015/0221667 A1* | 8/2015 | Fukuzumi ......... H01L 29/66833 257/314 |
| 2016/0099254 A1 | 4/2016 | Park et al. |
| 2016/0126252 A1 | 5/2016 | Tsuda et al. |
| 2017/0040339 A1* | 2/2017 | Lee .................. H01L 27/11565 |
| 2018/0240812 A1* | 8/2018 | Barbato ............. H01L 27/1157 |
| 2018/0350832 A1* | 12/2018 | Barbato ........... H01L 27/11582 |

FOREIGN PATENT DOCUMENTS

| | | |
|---|---|---|
| IT | 201700019392 A1 | 8/2018 |
| JP | 2010192531 A | 9/2010 |
| JP | 2015149413 A | 8/2015 |
| JP | 201692044 A | 5/2016 |
| KR | 10-2014-0138121 A | 12/2014 |
| KR | 20180042358 A | 4/2018 |
| TW | 201236110 A | 9/2012 |
| TW | 201436193 A | 9/2014 |
| WO | 2016053623 A2 | 4/2016 |

OTHER PUBLICATIONS

Chen, et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012. 91-92.

Chen, et al., "Highly Scalable Vertical Gate 3-D NAND", 2012 IEEE International Electron Devices Meeting (IEDM), Feb. 4, 2013, 9 pages.

Choi et al., "Performance Breakthrough in NOR Flash Memory With Dopant-Segregated Schottky-Barrier (DSSB) SONOS Devices," 2009 Symp. on VLSI Technology Jun. 16-18, 2009, Digest of Technical Papers, pp. 222-223.

Das, Arabinda, "Samsung 2x nm LPDDR3 DRAM Scales Memory Wall", EE Times, http://www.eetimes.com/author.asp?section id+36 &eoc id+1321629&print=yes, dated Mar. 25, 2014, 6 pages.

EP Extended Search Report from Application No. 19173569.5 dated Oct. 25, 2019, 9 pages.

Fukuzumi et al. "Optimal Integration and Characteristics of Vertical Array Devices for Ultra-High Density, Bit-Cost Scalable Flash Memory," IEEE Dec. 10-12, 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6 1-27.6 4.

Hung, et al., "A highly scalable vertical gate (VG) 3D NAND Flash with robust program disturb immunity using a novel PN diode decoding structure," 2011 Symp. on VLSI Technology (VLSIT), Jun. 14-16, 2011, 2 pages.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

JP Office Action from JP 2019-110091 with English Machine Translation, dated Mar. 24, 2021, 17 pages.

JP Office Action from JP 2019-110091 with English Translation dated Feb. 8, 2018, 10 pages.

Jung et al., "Three Dimensionally Stacked NAND Flash Memory Technology Using Stacking Single Crystal Si Layers on ILD and TANOS Structure for Beyond 30nmNode," IEEE IEDM, Dec. 11-13, 2006, 4 pages.

(56) References Cited

OTHER PUBLICATIONS

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Komori, et al., "Disturbless Flash Memory due to High Bloost Efficiency on BiCS Structure and Optimal Memory Film Stack for Ultra High Density Storage Device", Electron Devices Meeting, IEDM 2008, IEEE International, Dec. 15-17, 2008, SanFrancisco,California, 4 pages.

KR Office Action with English Translation from Application No. 10-2019-0056367 dated Mar. 30, 2020, 7 pages.

Lai et al., "A Multi-Layer Stackable Thin-Film Transistor (TFT) NAND-Type Flash Memory," IEEE Int'l Electron Devices Meeting, Dec. 11-13, 2006, 4 pages.

Lue, et al., "A highly scalable 8-layer 3D vertical-gate (VG) TFT NAND Flash using junction-free buried channel BE-SONOS device," 2010 Symposium on VLSI Technology (VLSIT), Jun. 15-17, 2010, 2 pages.

Nowak, et al., "Intrinsic fluctuations in Vertical NAND flash memories," VLSI Technology (VLSIT), 2012 Symposium on , vol., No., pp. 21,22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

TW English Translation of Office Action from Application No. TW 108122725 dated Jun. 11, 2020, 5 pages.

Wang, Michael, "Technology Trends on 3D-NAND Flash Storage", Impact 2011, Taipei, dated Oct. 20, 2011, found at 222.impact.org.tw/2011/files/newsfile/201111110190.pdf.

* cited by examiner

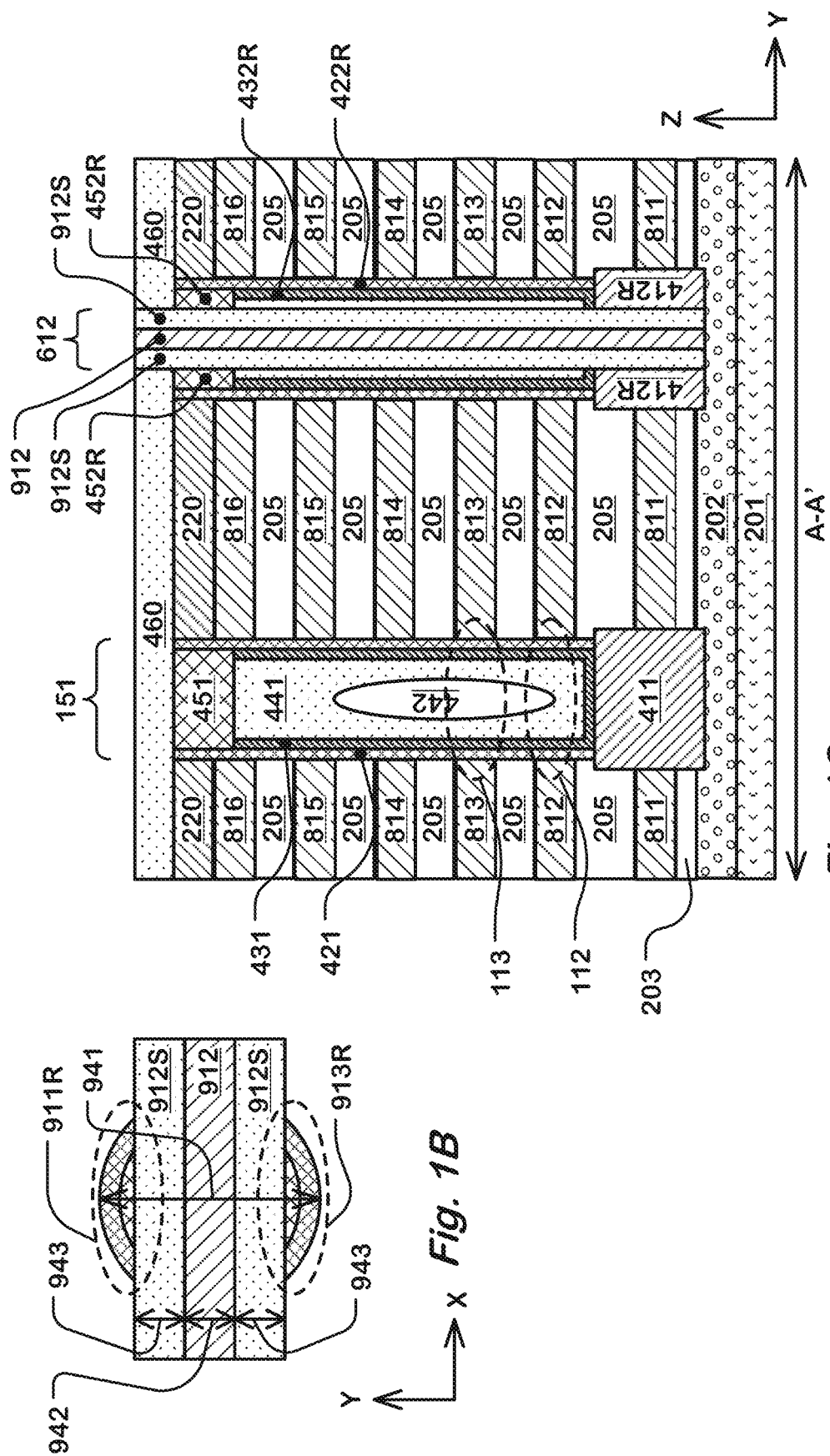

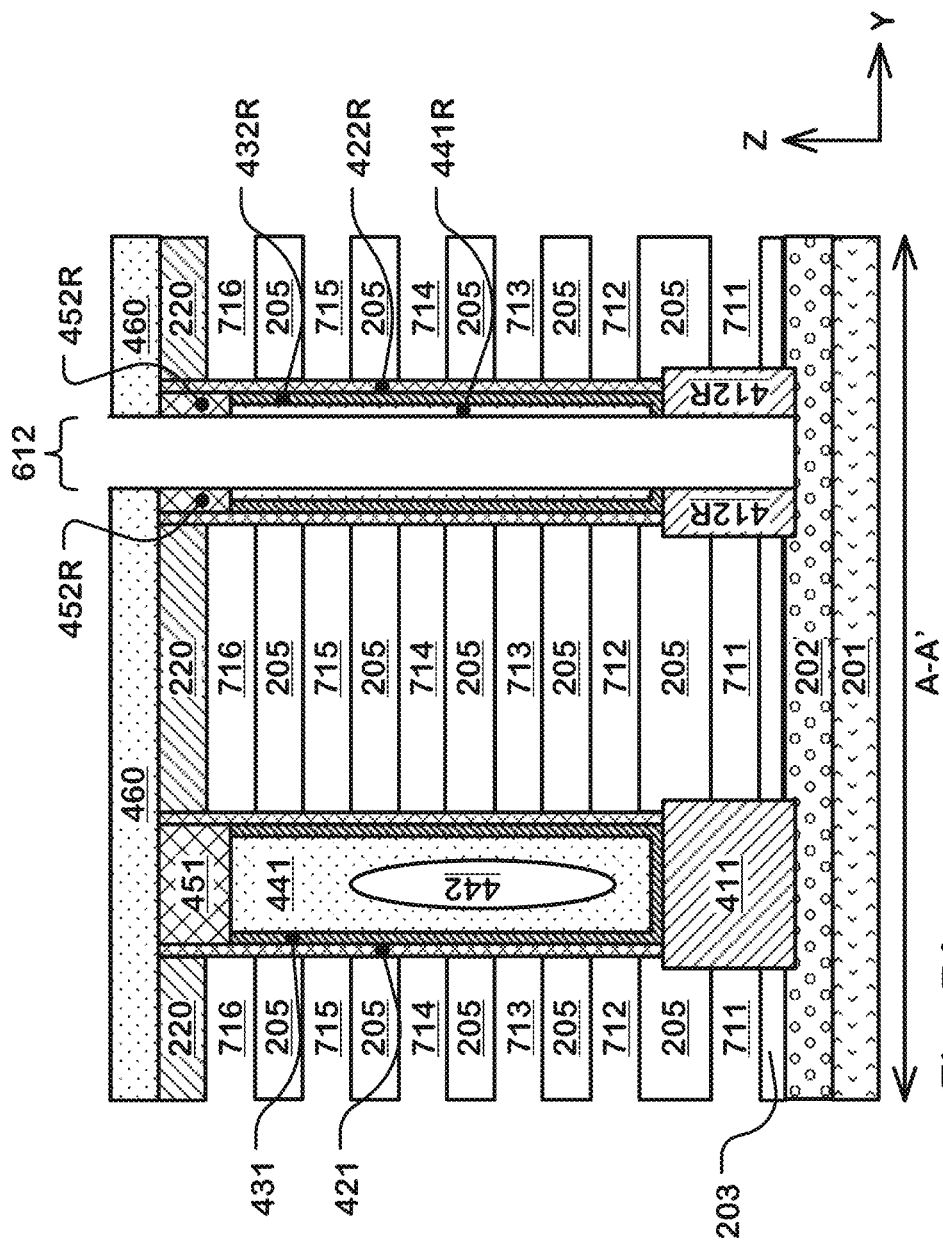

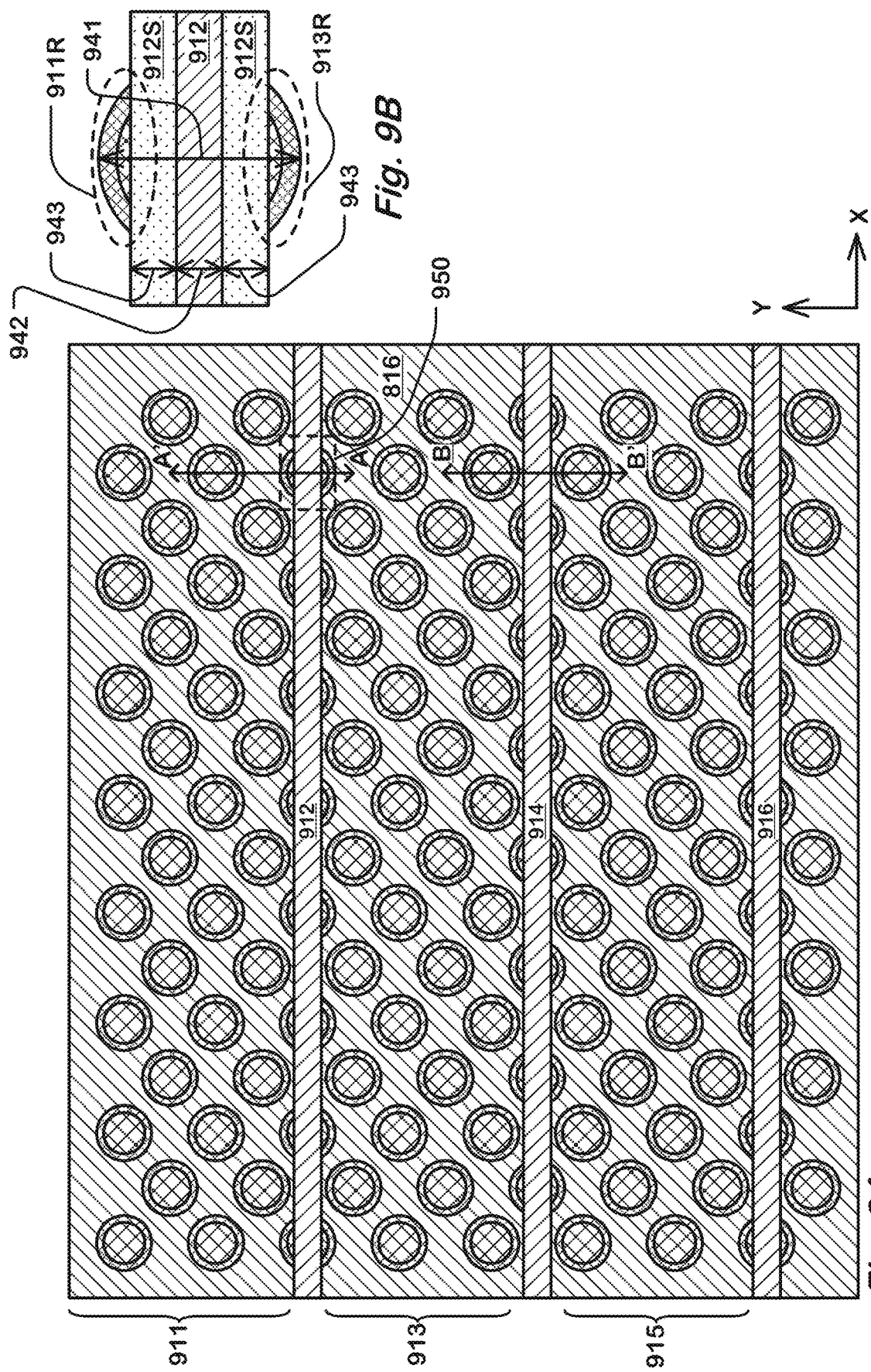

ARRAY OF PILLARS LOCATED IN A UNIFORM PATTERN

PRIORITY APPLICATION

This application is a divisional of U.S. patent application Ser. No. 16/384,421 filed 15 Apr. 2019 (now U.S. Pat. No. 11,037,947); which application is incorporated herein by reference.

BACKGROUND

Field

The present technology relates to high density memory devices, and particularly to memory devices in which multiple planes of memory cells are arranged to provide a three-dimensional 3D array.

Description of Related Art

In manufacturing a three-dimensional vertical channel NAND memory array, an array of holes can be patterned through layers of conductive materials, and an array of memory cells can then be formed in the array of holes. Source lines can be formed so that sub-arrays of holes are placed between adjacent source lines. A sub-array of holes placed between two adjacent source lines can include edge holes at edges of the sub-array that are closer to the adjacent source lines, and center holes at the center of the sub-array that are farther away from the adjacent source lines. Irregularities in the pattern of edge holes and center holes may cause imaging errors in manufacturing semiconductor devices, and may make portions of the array unusable. In some case, OPC (optical proximity correction) may be used to achieve uniform patterning between center holes and edge holes. However, OPC can increase the complexity of the photomask and the cost on photomask fabrication. In other cases, suitable OPC may not be available.

It is desirable to provide a memory architecture having high density, while reducing imaging errors.

SUMMARY

A memory device is provided comprising a stack of conductive layers, and an array of pillars through the stack. The pillars are arranged in a layout pattern of pillar locations that can reduce imaging errors. Each of the pillars comprises in an example embodiment a plurality of series-connected memory cells at cross-points between the pillars and the conductive layers. The pillars in the array are arranged in a set of rows of pillars extending in a first direction.

A first source line can be disposed vertically through the pillars of a particular row of pillars in the set of rows of pillars. A second source line can be disposed vertically through the pillars of a second particular row of pillars in the set of rows of pillars, wherein the set of rows of pillars includes a subset of rows of pillars including multiple members disposed between the first source line and the second source line. The pillars in the subset of rows of pillars can penetrate through the conductive layers in the stack and be surrounded by the conductive layers.

A source line conductor can be disposed beneath and electrically connected to the first source line, the second source line, and the subset of rows of pillars disposed between the first and second source lines.

The layout pattern can have a row pitch between pillar locations in a column of pillar locations extending in a second direction orthogonal to the first direction. The row pitch can be constant for pillar locations in the column including at least a pillar location of the first particular row through which the first source line is disposed, and all pillar locations in the column between the first and second source lines.

The stack of conductive layers can include one or more upper layers configured as string select gates, including one string select gate for the subset of rows of pillars, and a plurality of layers below the one or more upper layers configured as word lines.

The source line can be disposed in a slit having a sidewall extending through the conductive layers in the stack. In embodiments in which the source line is narrower than the pillars, or slightly misaligned, the sidewall on one or both sides of the slit can include a sequence of remnants of the pillars at the pillar locations of the first particular row of pillars through which the first source line is disposed.

The layout pattern can have a row offset in the second direction between adjacent pillar locations in adjacent columns of pillar locations. The layout pattern can have a column pitch in the first direction between adjacent pillar locations in a row of pillar locations, and can have a column offset in the first direction between adjacent pillar locations in adjacent rows of pillar locations. The pillars can have a first width in the second direction and the first source line can have a second width in the second direction narrower than the first width.

Remnants of the pillars can be disposed at the pillar locations of the first particular row of pillars through which the first source line is disposed. An insulating spacer can separate the remnants from the first source line. Conductive plugs can be disposed vertically between and connected to pillars in the array of pillars and the source line conductor, where the source line conductor is connected to the source line. Remnants of the conductive plugs can be disposed at the pillar locations of the first particular row of pillars through which the first source line is disposed.

In one embodiment, the first source line can be disposed vertically through the pillars of at least two adjacent rows of pillars in the set of rows of pillars including the first particular row of pillars. Remnants of the pillars can be disposed at the pillar locations of the at least two adjacent rows of pillars through which the first source line is disposed. An insulating spacer can separate the remnants from the first source line.

A method is also provided for manufacturing a memory device as described herein. The method can include forming a stack of conductive layers, and forming an array of pillars through the stack. Each of the pillars can comprise a plurality of series-connected memory cells located in a layout pattern of pillar locations at cross-points between the pillars and the conductive layers. The pillars in the array can be arranged in a set of rows of pillars extending in a first direction. The pillars in the subset of rows of pillars penetrate through the conductive layers in the stack and are surrounded by the conductive layers.

The method can include forming a first source line disposed vertically through the pillars of a first particular row of pillars in the set of rows of pillars. The method can include forming a second source line disposed vertically through the pillars of a second particular row of pillars in the set of rows of pillars, wherein the set of rows of pillars includes a subset of rows of pillars including multiple members disposed between the first source line and the second source line.

A source line conductor can be formed beneath and electrically connected to the first source line, the second source line, and the subset of rows of pillars disposed between the first and second source lines.

The layout pattern can have a row pitch between pillar locations in a column of pillar locations extending in a second direction orthogonal to the first direction. The row pitch can be constant for pillar locations in the column including at least a pillar location of the first particular row through which the first source line is disposed and all pillar locations in the column between the first and second source lines.

The layout pattern can have a row offset in the second direction between adjacent pillar locations in adjacent columns of pillar locations. The layout pattern can have a column pitch in the first direction between adjacent pillar locations in a row of pillar locations, and can have a column offset in the first direction between adjacent pillar locations in adjacent rows of pillar locations. The pillars can have a first width in the second direction and the first source line has a second width in the second direction narrower than the first width.

Forming the first source line can include etching a slit through the pillars of the first particular row of pillars, forming an insulating spacer in the slit, and filling the slit with a conductive material over the insulating spacer in the slit. Etching the slit can leave remnants of the pillars at the pillar locations of the first particular row of pillars, where the insulating spacer can separate the remnants from the first source line.

The method can include forming conductive plugs disposed vertically between vertical channel structures in the array of pillars and the source line conductor, wherein the source line conductor is connected to the first source line, and etching through the conductive plugs disposed vertically between vertical channel structures in the pillars of the first particular row of pillars and the source line conductor, leaving remnants of the conductive plugs at the pillar locations of the first particular row of pillars through which the first source line is disposed. The insulating spacer can separate the remnants of the conductive plugs from the first source line.

In one embodiment, the method can include etching a slit through the pillars of at least two adjacent rows of pillars in the set of rows of pillars including the first particular row of pillars, forming an insulating spacer in the slit, and filling the slit with a conductive material over the insulating spacer in the slit. Etching the slit can leave remnants of the pillars at the pillar locations of the at least two adjacent rows of pillars, where the insulating spacer can separate the remnants from the source line.

Other aspects and advantages of the present invention can be seen on review of the drawings, the detailed description and the claims, which follow.

BRIEF DESCRIPTION OF THE DRAWINGS

FIGS. 1A, 1B, 1C and 1D illustrate a 3D VC NAND memory device.

FIGS. 2, 3A, 3B, 4A, 4B, 5A, 5B, 5C, 6A, 6B, 7A, 7B, 8A, 8B, 9A and 9B illustrate an example process flow for manufacturing a memory device as described herein.

FIG. 2 illustrates a stage in the process flow after forming a stack of sacrificial layers separated by insulating layers on a substrate.

FIGS. 3A and 3B illustrate a stage in the process flow after forming an array of holes through the stack.

FIGS. 4A and 4B illustrate a stage in the process flow after forming an array of pillars in the array of holes.

FIGS. 5A, 5B and 5C illustrate a stage in the process flow after forming a mask over a set of rows of pillars as shown in FIGS. 4A and 4B.

FIGS. 6A and 6B illustrate a stage in the process flow after etching slits through the pillars at the pillar locations of particular rows of pillars.

FIGS. 7A and 7B illustrate a stage in the process flow after removing the sacrificial layers in the stack via the slits to form horizontal openings between the insulating layers.

FIGS. 8A and 8B illustrate a stage in the process flow after forming a conductive material in the horizontal openings via the slits to form a stack of conductive strips.

FIGS. 9A, 9B, 9C and 9D illustrate a stage in the process flow after forming an insulating spacer in a slit, and filling the slit with a conductive material over the insulating spacer to form a source line.

DETAILED DESCRIPTION

Figure 1A:
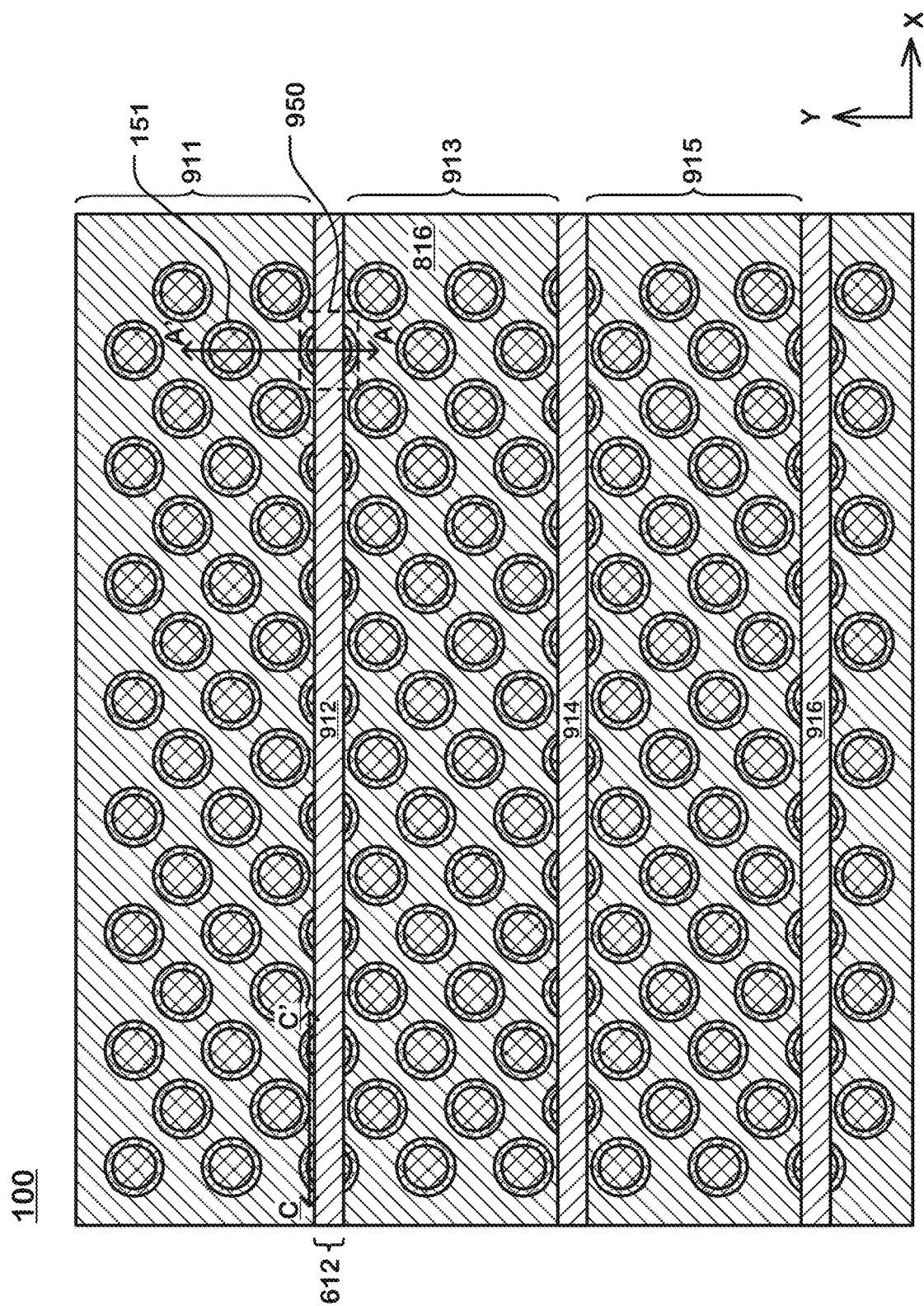

A detailed description of embodiments of the present invention is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIGS. 1A, 1B, 1C and 1D illustrate a 3D (three-dimensional) VC (vertical channel) NAND memory device. FIG. 1A is a simplified horizontal cross-sectional diagram of a 3D VC NAND memory device 100. FIG. 1A is taken at a level of an upper conductive layer 816 in a stack of conductive layers 811-816 on a substrate 201 as shown in FIG. 1C. FIG. 1B illustrates an enlarged view of an area 950 in FIG. 1A. FIG. 1C is a simplified vertical cross-sectional the 3D VC NAND memory device. FIG. 1C is taken along a line A-A' as shown in FIG. 1A.

An array of pillars (151, FIGS. 1A and 1C) is disposed through the stack. Each of the pillars (151) comprises in an example embodiment a plurality of series-connected memory cells (e.g. 112, 113, FIG. 1C) located in a layout pattern of pillar locations at cross-points between the pillars and the conductive layers (e.g. 812-813, FIG. 1C). A layout pattern of pillar locations is described in reference to FIG. 3A.

As shown in FIG. 1A, the pillars in the array are arranged in a set of rows of pillars extending in a first direction (X-direction). A first source line 912 (FIGS. 1A and 1C) can be disposed vertically through the pillars s of a first particular row of pillars in the set of rows of pillars.

A second source line 914 (FIG. 1A) can be disposed vertically through the pillars of a second particular row of pillars. The set of rows of pillars includes a subset of rows of pillars (913, FIG. 1A) including multiple members disposed between the first source line 912 and the second source line 914. Similarly, another subset of rows of pillars 915 is disposed between two source lines 914 and 916.

A source line conductor (202, FIG. 1C) is disposed beneath and electrically connected to the first source line 912, the second source line 914 (FIG. 1A), and the subset of rows of pillars (913, FIG. 1A) disposed between the first and second source lines.

As shown in FIG. 1A, the pillars in the subset of rows of pillars disposed between the first source line 912 and the second source line 914 penetrate through the conductive layers (e.g. 816) in the stack and are surrounded by the conductive layers. Memory cells located at cross-points between the pillars and the conductive layers can be gate all around GAA cells.

FIG. 1B illustrates an enlarged view of an area 950 in FIG. 1A. As shown in FIG. 1B, the pillars have a first width 941 in the second direction (Y-direction) and a source line 912 has a second width 942 in the second direction narrower than the first width. Remnants (911R, 913R) of the pillars can be disposed at the pillar locations of the particular row of pillars through which the source line 912 is disposed. An insulating spacer 912S can separate the remnants from the source line 912. The insulating spacer 912S can have a third width 943. In one embodiment, the first width 941 of a pillar in the second direction can be greater than a sum of the second width 942 of a source line plus two times the third width 943 of an insulating spacer. For instance, the first width 941 of a pillar in the second direction can be 130 nm (nanometer), the second width 942 of a source line in the second direction can be 30 nm, and the third width 943 of an insulating spacer can be 30 nm.

As shown in FIG. 1C, a stack of conductive layers separated by insulating layers 205 can include an upper conductive layer 816 that can be configured as string select lines SSL, a plurality of intermediate conductive layers (812-815) that can be configured as word lines WL, and a lower conductive layer (811) that can be configured as ground select lines GSL. Pillars in the array of pillars can include charge storage structures 421, vertical channel structures 431, and landing pads 451 connected to the charge storage structures 421 and the vertical channel structures 431 at upper ends. The pillars can include an insulating fill 441 such as silicon dioxide surrounded by and in contact with the vertical channel structures 431. The insulating fill 441 can include an air gap 442. A bottom insulating layer 203 separates the lower conductive layer 811 from the substrate 201. A hard mask 220 can be disposed on top of the stack of conductive layers. An insulating layer 460 can be disposed over the landing pads 451.

Conductive plugs 411 can be disposed vertically between and connected to pillars in the array of pillars and a source line conductor 202 on the substrate 201, where the source line conductor 202 is connected to the source line 912. The conductive plugs can have a top surface below the plurality of intermediate conductive layers (812-815) and above the lower conductive layer 811. In one embodiment, a conductive plug can be a crystalline semiconductor plug formed by epitaxial growth from the substrate, and a silicon P type well on the substrate 201 can act as the source line conductor 202.

Figure 3A:
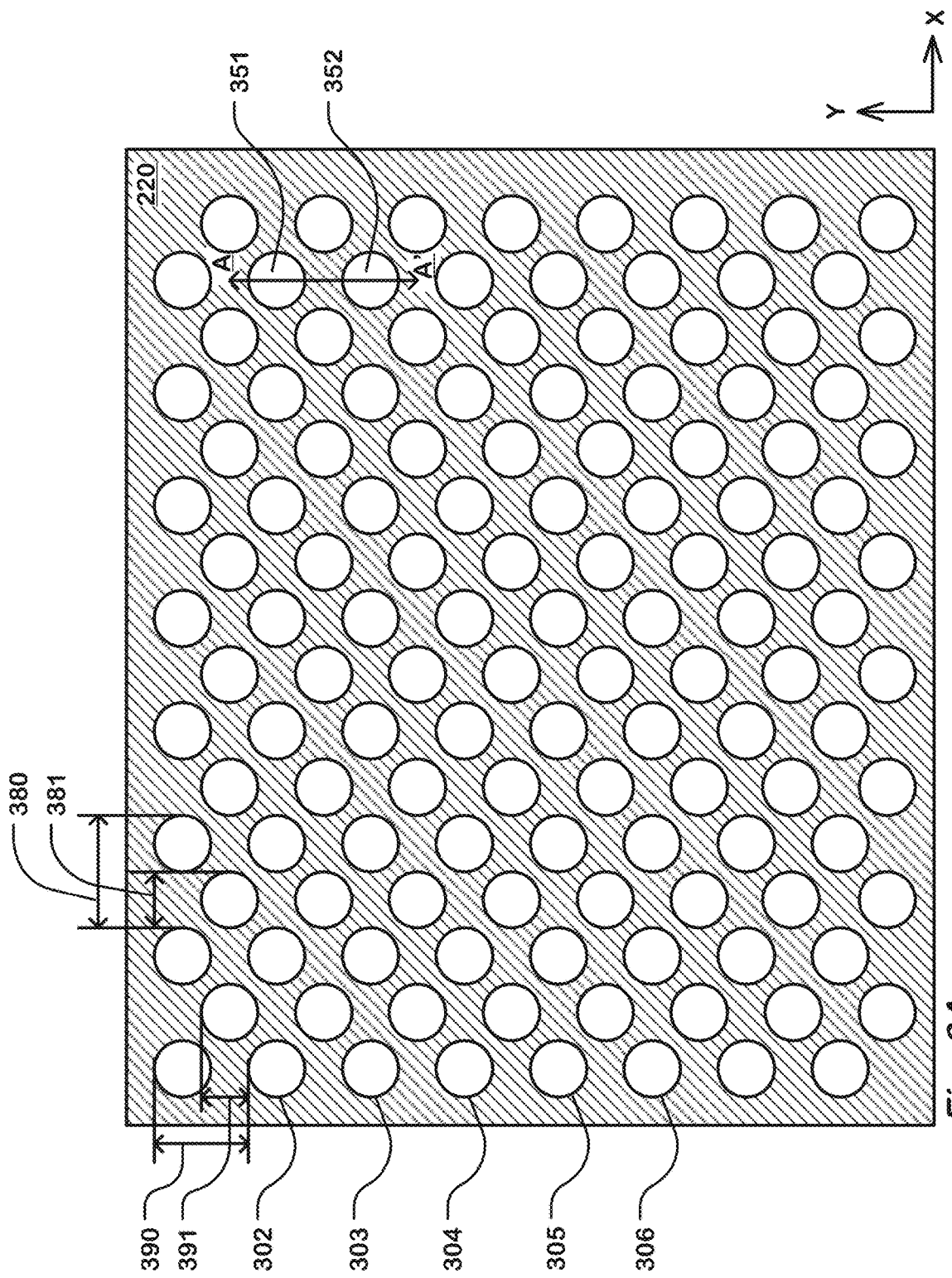

As shown in FIG. 1C, remnants (911R, 913R, FIG. 1B) of the pillars can include remnants of 452R of landing pads, and remnants 422R of charge storage structures 422. Remnants of the pillars can also include remnants 432R of vertical channel structures at the pillar locations of the particular row of pillars through which the source line 912 is disposed. Remnants 412R of the conductive plugs can be disposed at the pillar locations of the particular row of pillars through which the source line 912 is disposed. Whether remnants of the pillars remain at the trench or not, the present technology allows use of the layout pattern as shown in the example of FIG. 3A or similar so that the lithography will be more uniform throughout all the pillars actually in the final device. This results in higher density and better yield.

As shown in FIG. 1C, the stack of conductive layers can include one or more upper layers (e.g. 816) configured as string select gates, including one string select gate for the subset of rows of pillars (913, FIG. 1A), and a plurality of layers (e.g. 811-815) below the one or more upper layers configured as word lines.

Figure 1D:
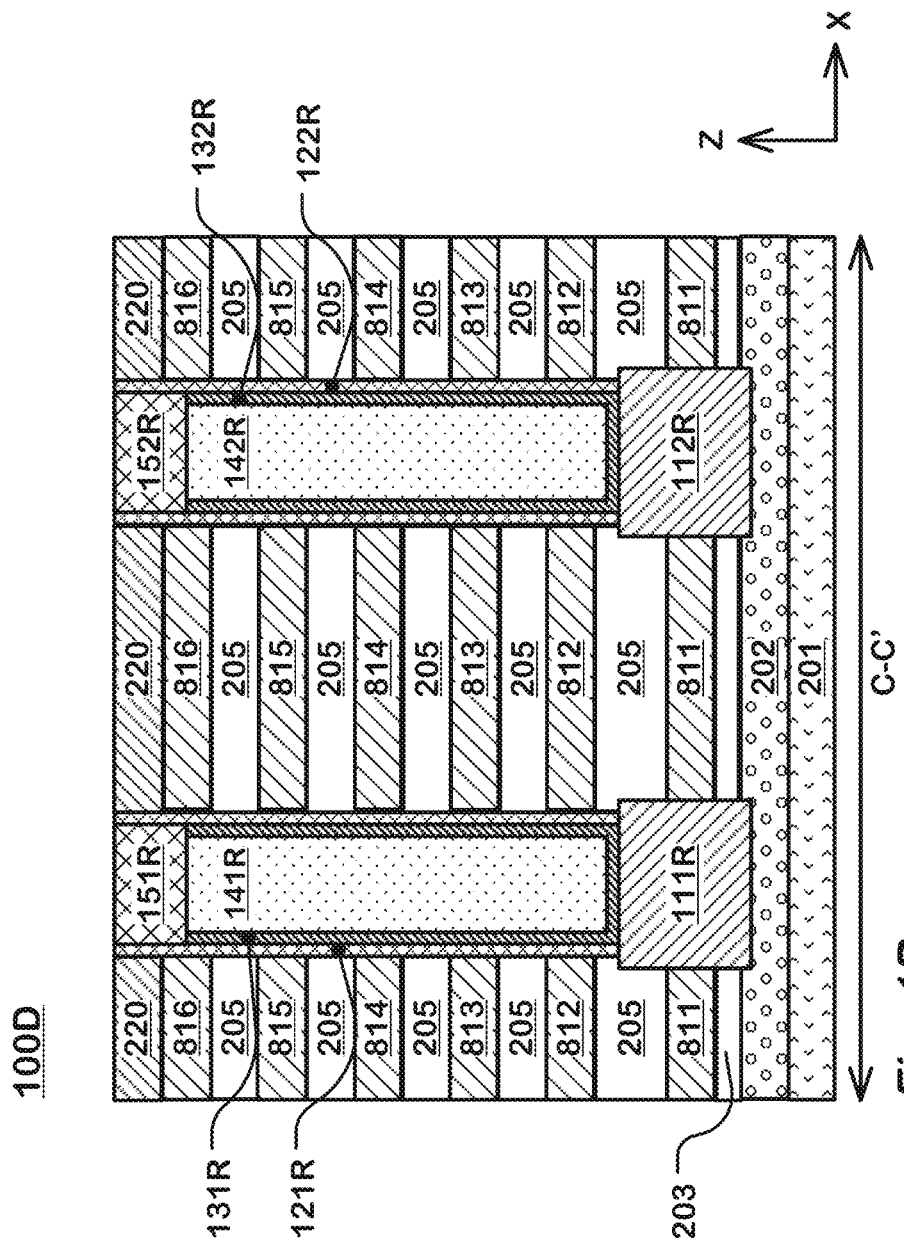

FIG. 1D illustrates a sidewall of a slit extending through the conductive layers in the stack, in a vertical cross section of the structure taken along a line C-C' as shown in FIG. 1A, where a source line 912 is disposed in a slit 612. In embodiments in which the source line is narrower than the pillars, or slightly misaligned, a sidewall as shown in FIG. 1D can be on one or both sides of a slit.

As shown in FIG. 1D, a sidewall 100D of a slit 612 (FIGS. 1A, 6A, and 9C) extends through the conductive layers (811-816) in the stack. The sidewall includes a sequence of remnants of the pillars at the pillar locations of the particular row of pillars through which the source line (912, FIG. 1A) is disposed. The remnants of the pillars can include remnants 111R and 112R of conductive plugs, remnants 121R and 122R of charge storage structures, remnants 131R and 132R of vertical channel structures, remnants 141R and 142R of insulating fills, and remnants 151R and 152R of landing pads.

FIGS. 2, 3A, 3B, 4A, 4B, 5A, 5B, 5C, 6A, 6B, 7A, 7B, 8A, 8B, 9A and 9B illustrate an example process flow for manufacturing a memory device as described herein.

Figure 2:
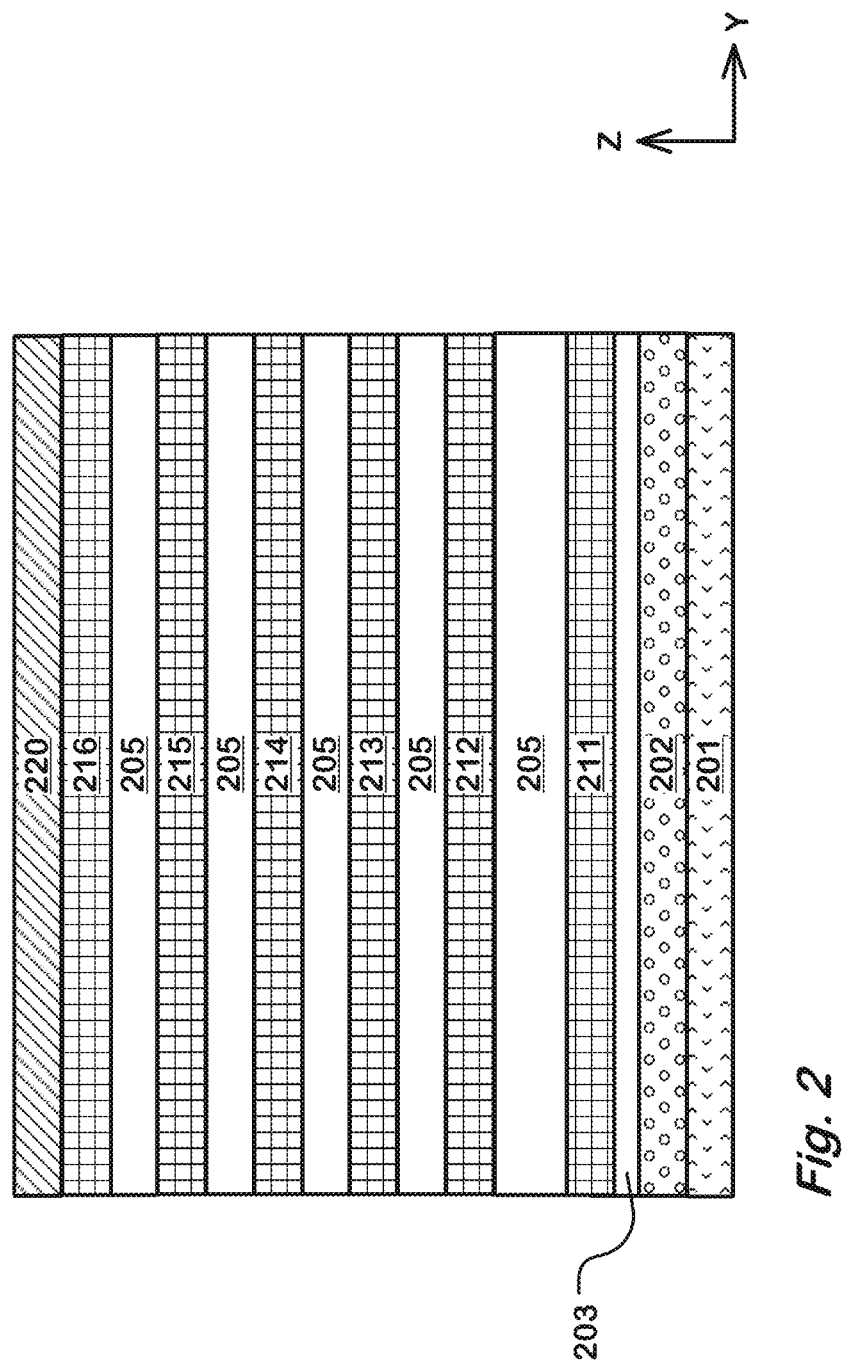

FIG. 2 illustrates a stage in the process flow after forming a stack of sacrificial layers (211-216) separated by insulating layers (205) on a substrate (201). The stack of sacrificial layers can include an upper sacrificial layer (216), a plurality of intermediate sacrificial layers (212-215), and a lower sacrificial layer (211). A bottom insulating layer (203) separates the lower sacrificial layer (211) in the stack of sacrificial layers from the substrate (201). A hard mask 220 can be disposed on top of the stack of sacrificial layers. A silicon P type well structure disposed on the substrate 201 can act as a source line conductor 202, as further described in reference to FIG. 4B.

The sacrificial layers in the stack of sacrificial layers can include silicon nitride, and can be replaced later in the process with a conductive material to form a stack of conductive layers.

Figure 3B:
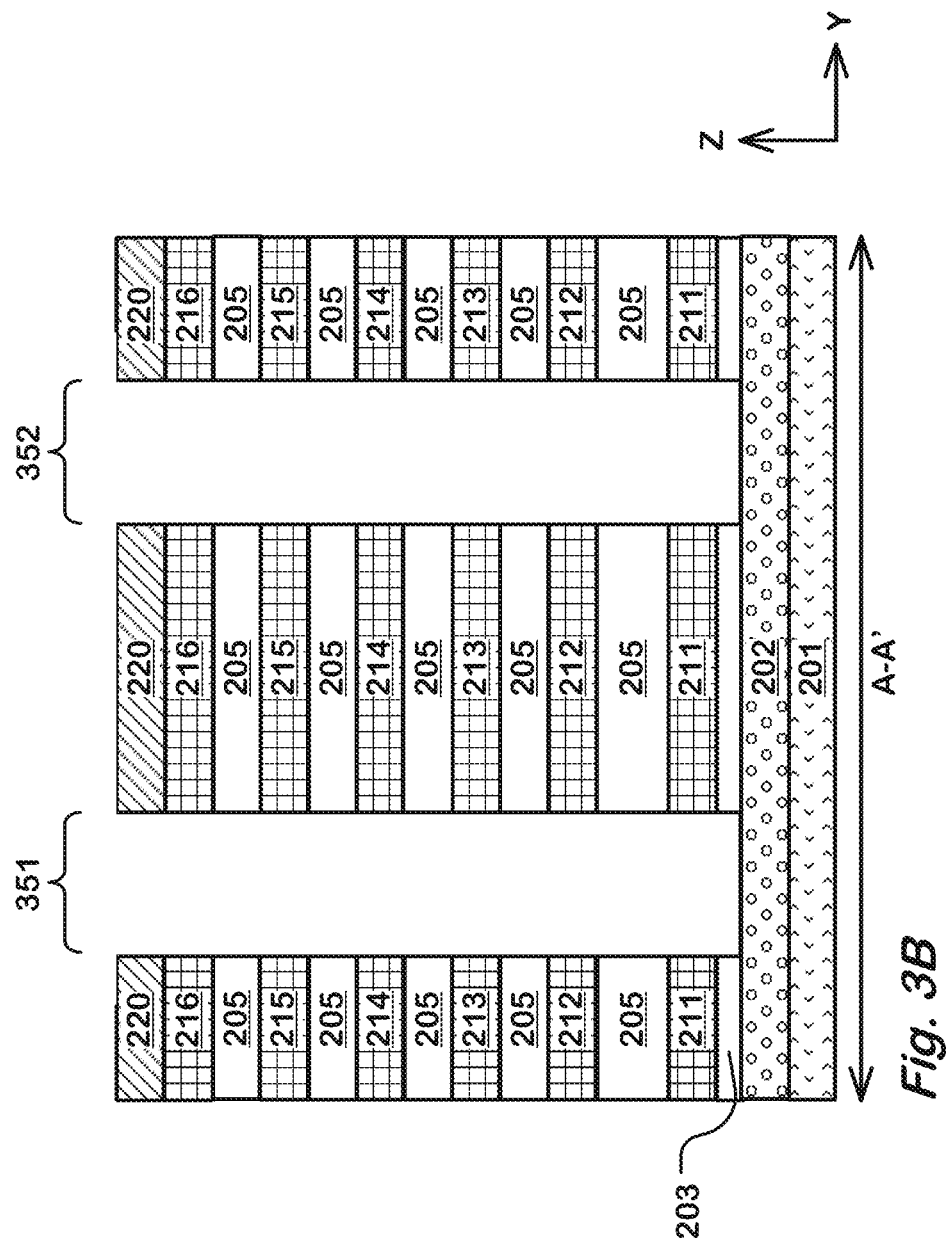

FIGS. 3A and 3B illustrate a stage in the process flow after forming an array of holes (e.g. 351, 352) through the stack. The holes in the array are located in a layout pattern of pillar locations. The holes in the array are arranged in a set of rows of pillars extending in a first direction (X-direction). FIG. 3A illustrates a top view of the structure at this stage in the process.

As shown in FIG. 3A, the layout pattern can have a row pitch 390 between pillar locations in a column of pillar locations (302-306) extending in a second direction (Y-direction) orthogonal to the first direction. The row pitch can be constant for pillar locations in the column including at least a pillar location 303 of the first particular row of pillars through which the first source line is disposed, and all pillar locations (304, 305) in the column between the first and second source lines (912, 914, FIG. 1A). The layout pattern can have a row offset 391 in the second direction between adjacent pillar locations in adjacent columns of pillar locations.

As shown in FIG. 3A, the layout pattern can have a column pitch (380) in the first direction between adjacent pillar locations in a row of pillar locations. The layout pattern can have a column offset 381 in the first direction between adjacent pillar locations in adjacent rows of pillar locations.

FIG. 3B illustrates a vertical cross sectional view of the structure shown in FIG. 3A, taken at a line A-A' across holes 351 and 352. The line A-A' is oriented in a second direction (Y-direction) orthogonal to the first direction. As shown in the example of FIG. 3B, the holes (e.g. 351, 352) are formed through the stack of sacrificial layers 211-216.

Figure 4A:
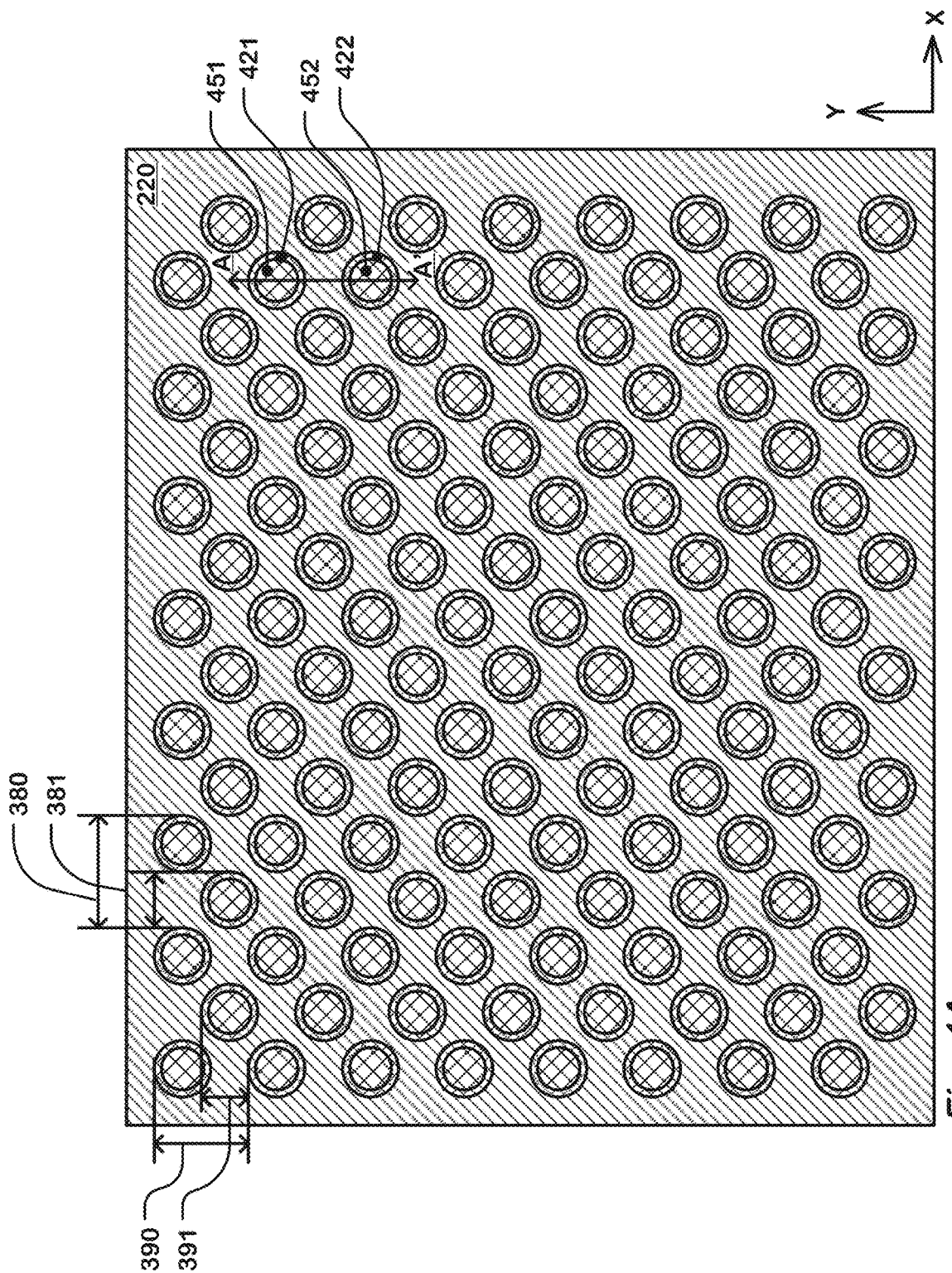
Figure 4B:
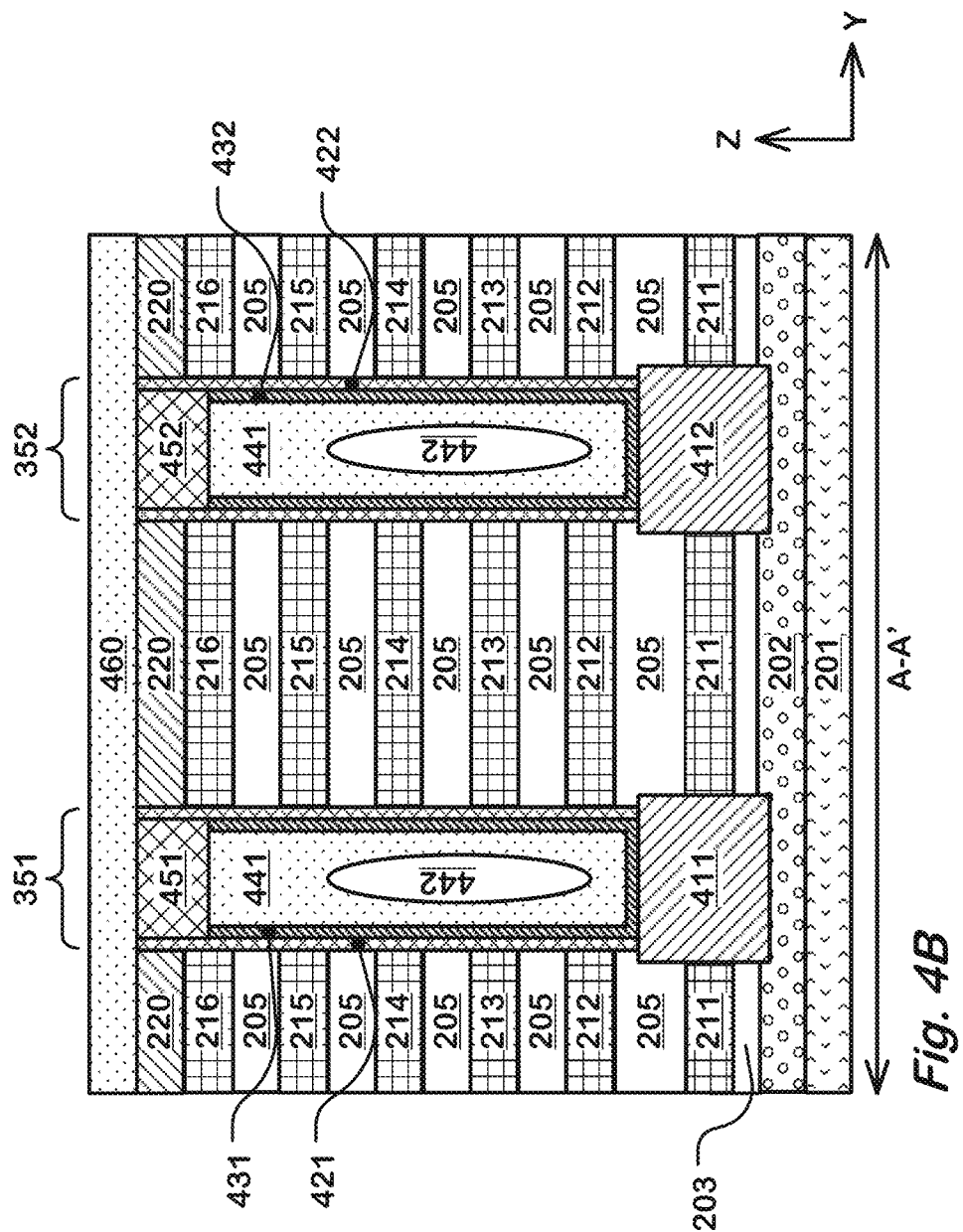

FIGS. 4A and 4B illustrate a stage in the process flow after forming an array of pillars in the array of holes (e.g. 351, 352, FIGS. 3A and 3B). The array of pillars are disposed through the stack. Each of the pillars can comprise a plurality of series-connected memory cells. The pillars in the array are located in a layout pattern of pillar locations at cross-points between the pillars and the conductive layers. The layout pattern is further described in reference to FIG. 3A. The pillars in the array are arranged in a set of rows of pillars in the first direction (X-direction). FIG. 4A illustrates a top view of the structure at this stage in the process.

As shown in FIG. 4A, a first pillar including a charge storage structure 421 and a landing pad 451, and a second pillar including a charge storage structure 422 and a landing pad 452 are disposed along a line A-A' at pillar locations of a column of pillars, in holes 351 and 352 as shown in FIG. 3A. The line A-A' is oriented in a second direction (Y-direction) orthogonal to the first direction.

FIG. 4B illustrates a vertical cross sectional view of the structure taken at the line A-A' as shown in FIG. 4A. The process can include forming conductive plugs (411 and 412) in the holes (351 and 352). The conductive plugs can be disposed vertically between pillars in the array of pillars and a source line conductor 202 on the substrate 201. The conductive plugs can have a top surface below the plurality of intermediate sacrificial layers (212-216) and above the lower sacrificial layer (211). In one embodiment, a conductive plug can be a crystalline semiconductor plug formed by epitaxial growth from the substrate, and a silicon P type well on the substrate 201 can act as the source line conductor 202. A conductive plug (e.g. 411) can connect the source line conductor 202 to a vertical channel structure (e.g. 431) in the hole (e.g. 351).

The process can include forming charge storage structures (421, 422) over sidewalls of the holes (351, 352). Charge storage structures can include multilayer dielectric charge trapping structures known from flash memory technologies as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon), or other charge trapping layers or combinations of those layers.

The process can include forming vertical channel structures (431, 432) over the charge storage structures and over the top surface of the conductive plugs (411, 412). Vertical channel structures can include one or more polysilicon films. The process can include a fill step to fill the holes with an insulating fill 441 such as silicon dioxide. The process can leave an air gap 442 in the insulating fill.

After the fill step, an etch back step can be applied to form recesses over and expose the top surface of the vertical channel structures (431, 432). Landing pads (451, 452) can be formed on and in contact with the vertical channel structures in the holes (e.g. 351, 352). The landing pads can seal the recesses. A planarizing step such as chemical mechanical polishing can be applied to the landing pads, and an insulating layer 460 can be formed over the landing pads.

Figure 5A:
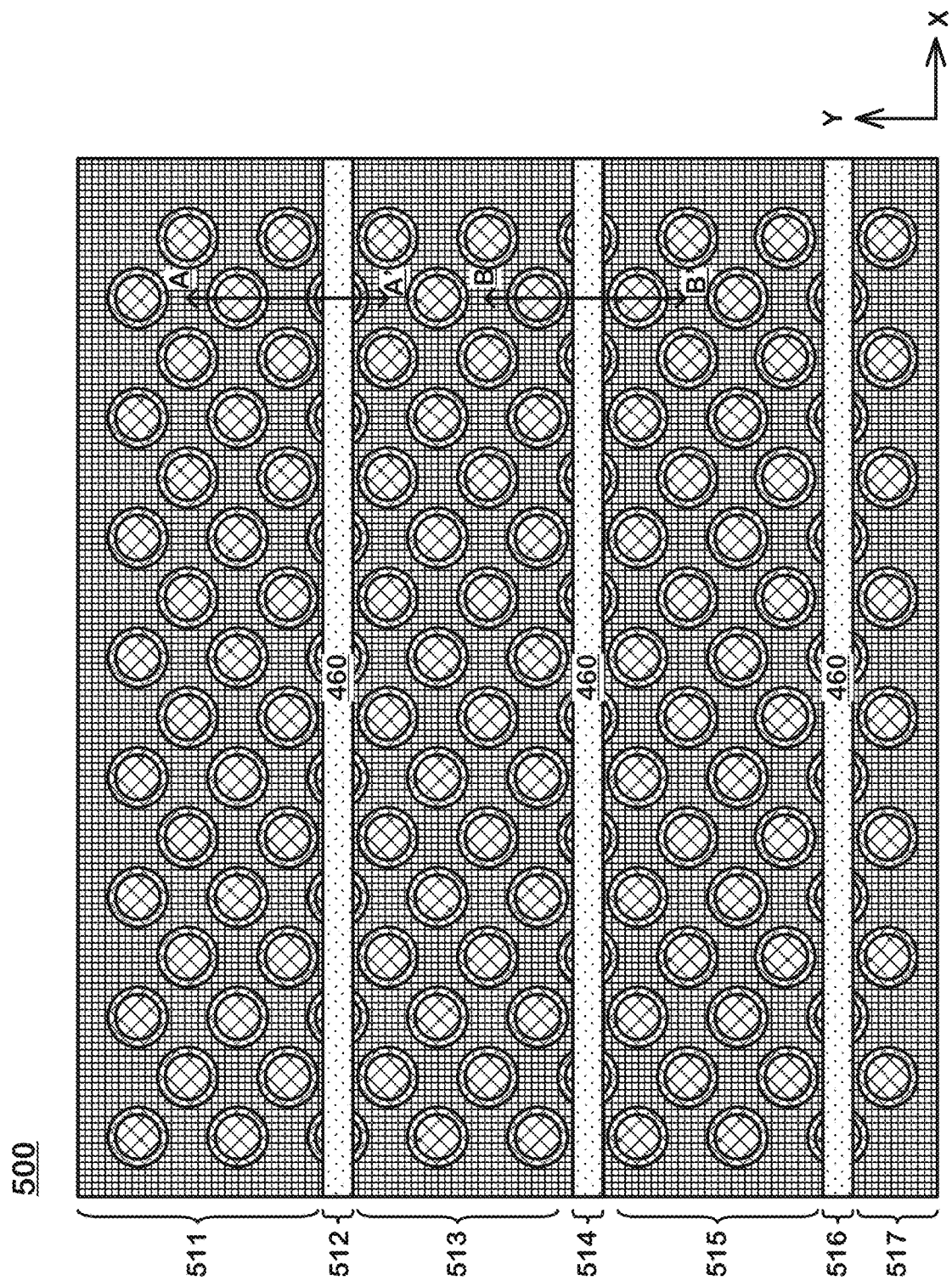
Figure 5B:
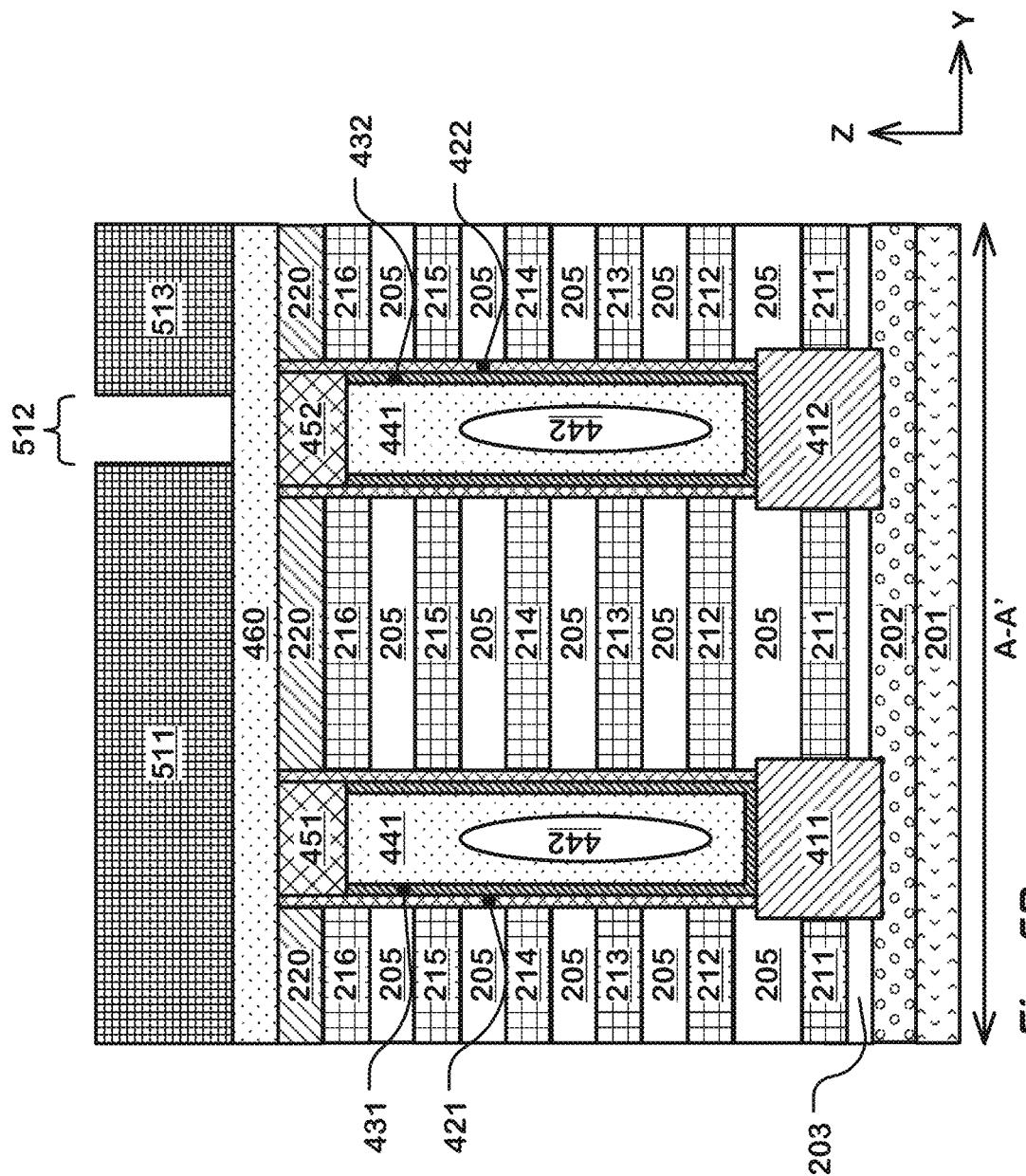
Figure 5C:
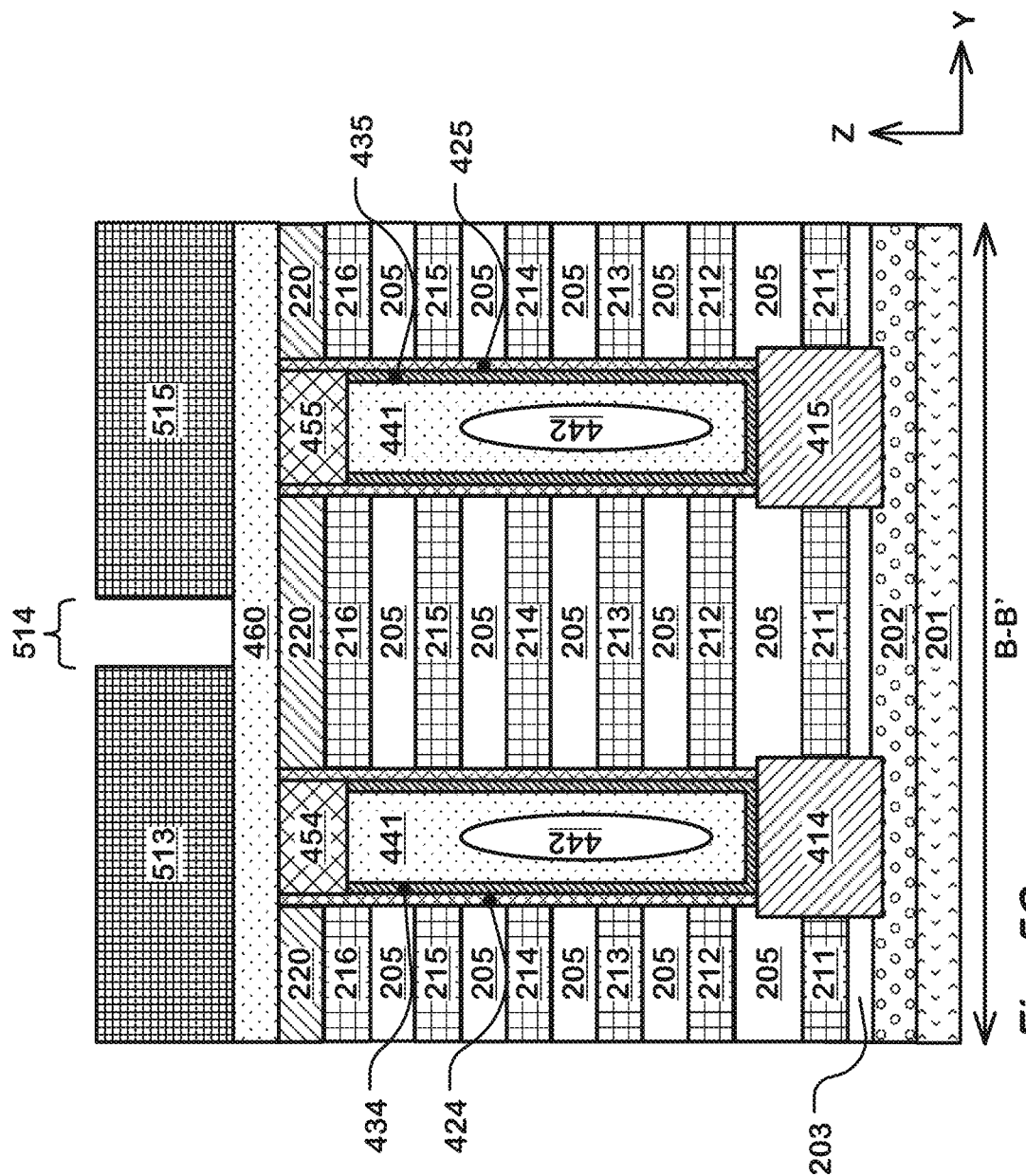

FIGS. 5A, 5B and 5C illustrate a stage in the process flow after forming a mask over a set of rows of pillars as shown in FIGS. 4A and 4B. FIG. 5A illustrates a mask 500 including mask areas (511, 513, 515, 517) that are opaque to light, and open areas (512, 514, 516) that allow light to shine through. The mask can comprise photoresist materials such as APF (Advanced Patterning Film) comprising amorphous carbon, or a tri-layer approach APF/SHB (Silicon Containing Hardmask Bottom)/APF.

The mask areas are disposed over an insulating layer 460 (FIG. 5B) over respective subsets of rows of pillars in the set of rows of pillars. To show the layout of the mask areas and the open areas relative to the rows of pillars in the set disposed beneath the mask areas beneath an insulating layer 460, the rows of pillars are illustrated in FIG. 5A. A subset of rows of pillars can include two or more rows of pillars, and is disposed between two adjacent open areas. An open area extends in the first direction (X-direction), and is disposed over a particular row of pillars in the set of rows of pillars, between two adjacent subsets of rows of pillars. A particular row of pillars over which an open area is disposed is not in a subset of rows of pillars over which a mask area is disposed.

FIG. 5B illustrates a vertical cross section of the structure shown in FIG. 5A, including an open area in the mask aligned over a particular row of pillars, taken along a line A-A' as shown in FIG. 5A. An open area 512 in the mask between the mask areas 511 and 513 is aligned over a particular row of pillars in the set of rows of pillars. The particular row of pillars includes a first pillar including a charge storage structure 422, a vertical channel structure 432, and a landing pad 452. A mask area 511 in the mask is disposed over a second pillar including a charge storage structure 421, a vertical channel structure 431, and a landing pad 451.

FIG. 5C illustrates a vertical cross section of the structure shown in FIG. 5A, including an open area in the mask between and not over two adjacent pillars in a column of pillars, taken along a line B-B' as shown in FIG. 5A. An open area 514 between the mask areas 513 and 515 in the mask is disposed between and not over two adjacent pillars in a column of pillars along the line B-B'. The mask areas 513 and 515 can be disposed over the first and second pillars, respectively. The two adjacent pillars in a column can include a first pillar and a second pillar. The first pillar can include a charge storage structure 424, a vertical channel structure 434, a landing pad 454 and a conductive plug 414. The second pillar can include a charge storage structure 425, a vertical channel structure 435, and a landing pad 455, and a conductive plug 415.

Figure 6A:
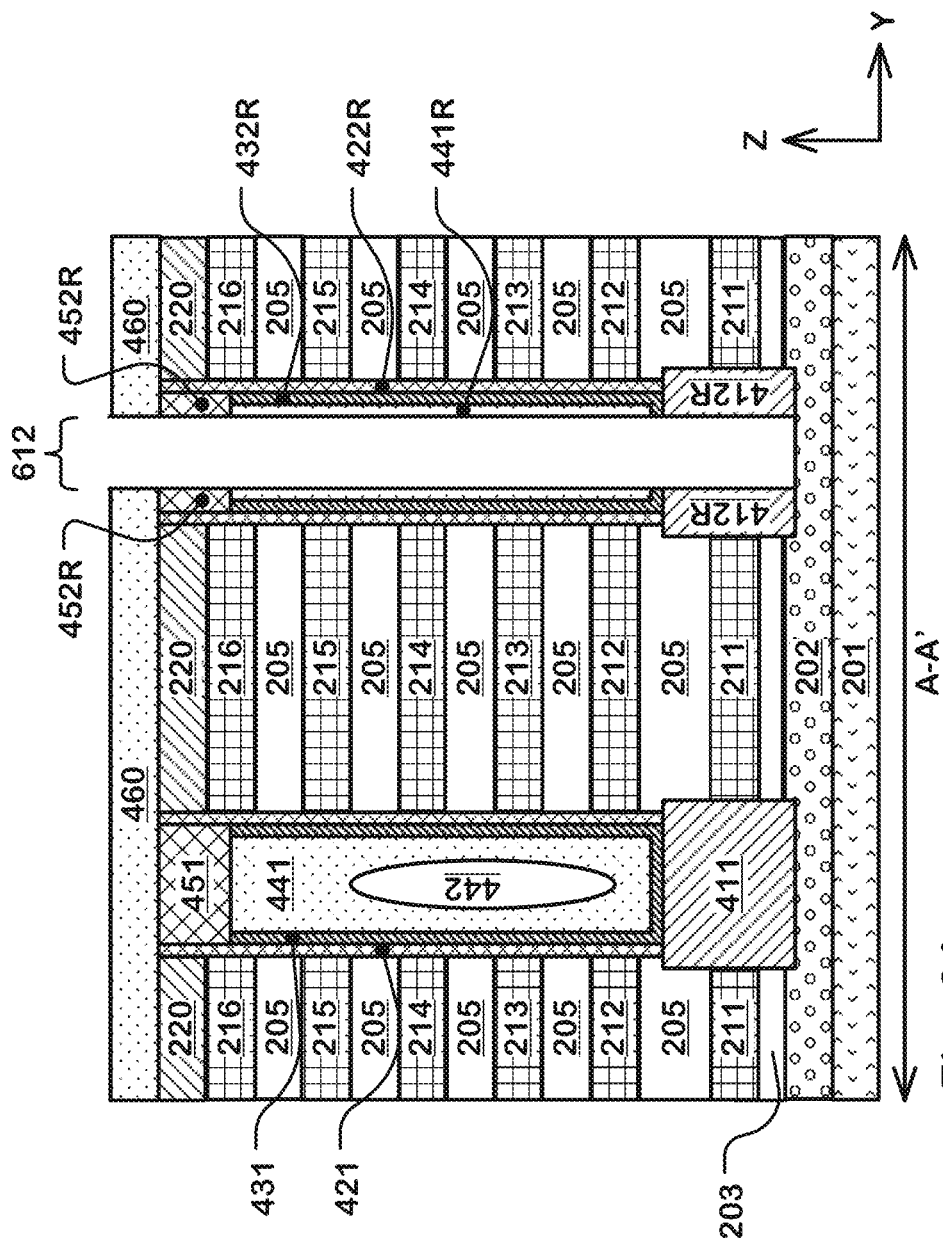
Figure 6B:
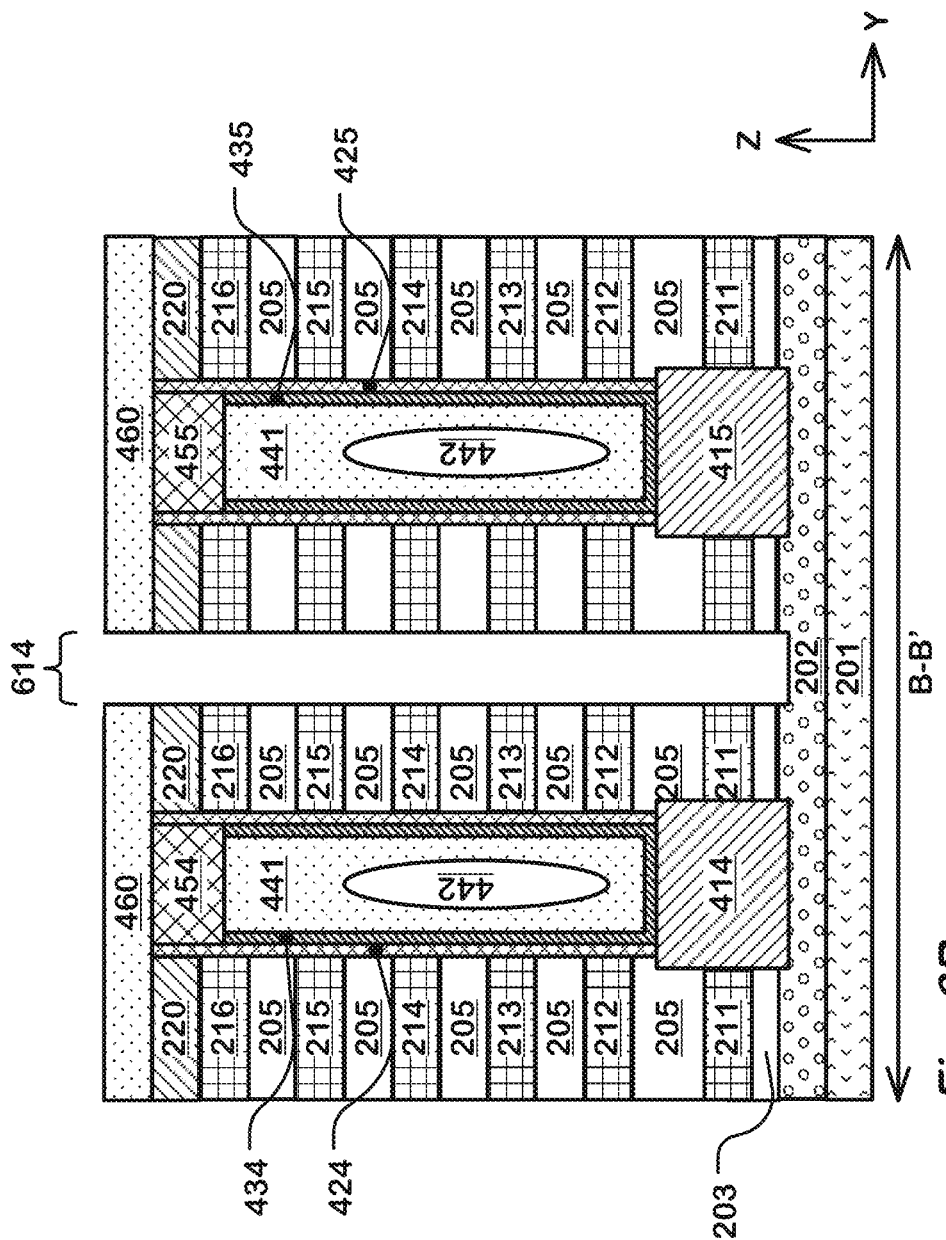

FIGS. 6A and 6B illustrate a stage in the process flow after etching slits through the pillars of the particular rows of pillars, using the mask 500 as described in reference to FIGS. 5A, 5B and 5C. FIG. 6A illustrates a vertical cross section of the structure, taken along a line A-A' as shown in FIG. 5A, after a slit 612 is etched through the pillars of the particular row of pillars. This etch step can use the mask as described in reference to FIG. 5B. The slit 612 can be etched through the open area 512 shown in FIG. 5B to the source line conductor 202.

As shown in the example of FIG. 6A, the etch step can include etching through elements in the pillars of the particular row of pillars, including an insulating layer 460 disposed beneath the mask 500, a landing pad 452 (FIG. 5B) disposed beneath the insulating layer 460, a charge storage structure 422 (FIG. 5B), a vertical channel structure 432 (FIG. 5B), an insulating fill 441, and a conductive plug 412 (FIG. 5B).

In one embodiment, the etch step can leave remnants of the pillars of the particular row of pillars. The remnants of the pillars can include remnants 452R of the landing pad 452, remnants 422R of the charge storage structure 422, remnants 432R of the vertical channel structure 432, remnants 441R of the insulating fill 441, and remnants 412R of the conductive plug 412. In an alternative embodiment, this etch step can remove all of the pillars of the particular row of pillars, then at a later stage in the process a source line (e.g. 912, FIG. 9C) can be formed at the "pillar locations" of the particular row of pillars, and no remnants of the pillar will remain.

FIG. 6B illustrates a vertical cross section of the structure, taken along a line B-B' as shown in FIG. 5A, after a slit 614 is etched through an insulating layer 460 disposed beneath the mask 500, and through the stack of sacrificial layers (211-216). This etch step can use the mask as described in reference to FIG. 5C. The slit 614 can be etched through the open area 514 shown in FIG. 5C to the source line conductor 202.

As shown in the example of FIG. 6B, the slit 614 is disposed between two adjacent pillars in a column of pillars along the line B-B'. The two adjacent pillars in a column can include a first pillar including a charge storage structure 424, a vertical channel structure 434, and a landing pad 454, and a second pillar including a charge storage structure 425, a vertical channel structure 435, and a landing pad 455.

Figure 7B:
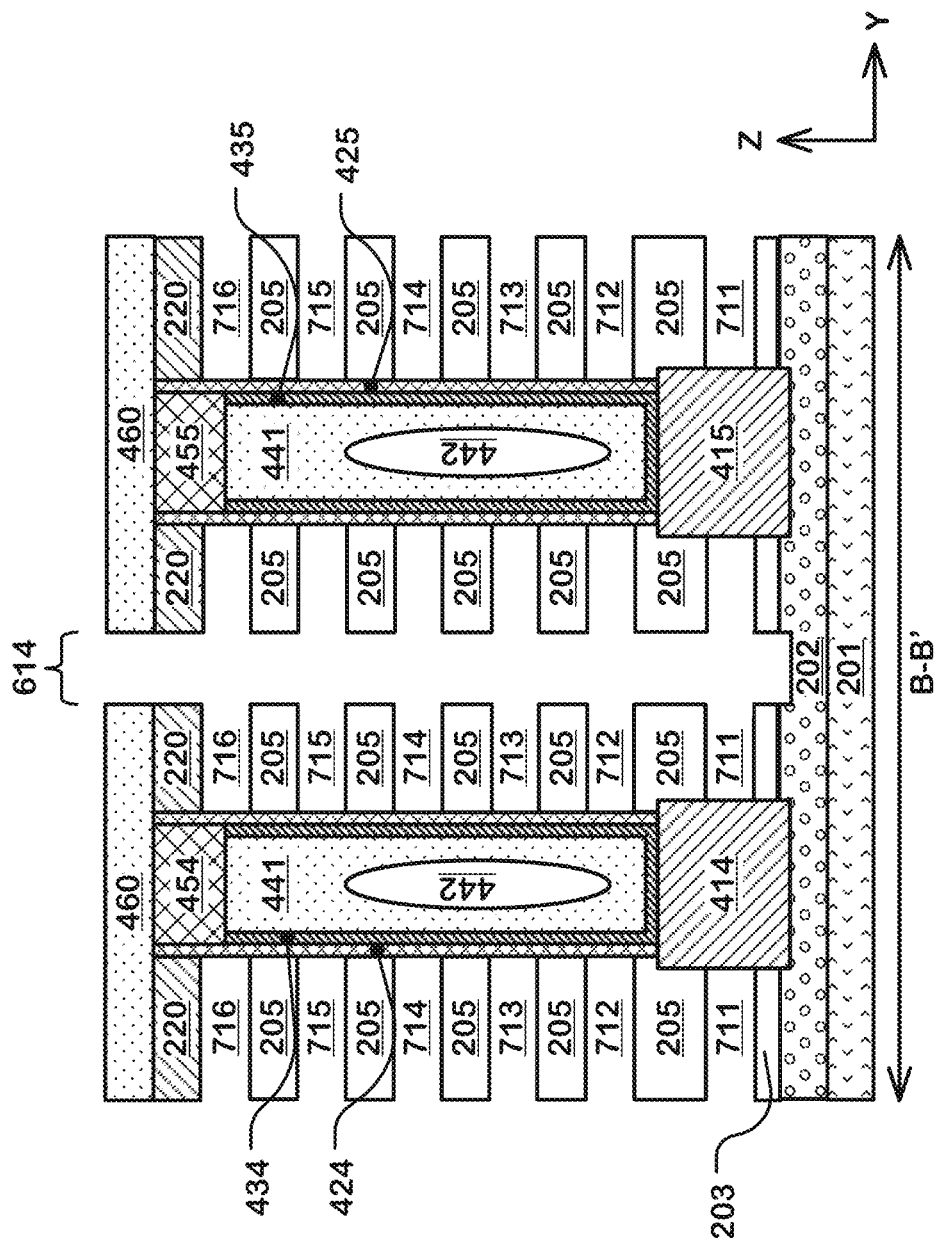

FIGS. 7A and 7B illustrate a stage in the process flow after removing the sacrificial layers (211-216, FIGS. 6A and 6B) in the stack via the slits (612, FIG. 7A; 614, FIG. 7B) to form horizontal openings 711-716 between the insulating layers (205, 203). The horizontal openings can include a top opening layer 716, a plurality of intermediate opening layers 712-715, and a bottom opening layer 711, corresponding to an upper sacrificial layer (216, FIGS. 6A and 6B), a plurality of intermediate sacrificial layers (212-215, FIGS. 6A and 6B), and a lower sacrificial layer (211, FIGS. 6A and 6B), respectively.

FIG. 7A illustrates a vertical cross section of the structure, taken along a line A-A' as shown in FIG. 5A, after the sacrificial layers (211-216, FIG. 6A) are removed. FIG. 7B illustrates a vertical cross section of the structure, taken along a line B-B' as shown in FIG. 5A, after the sacrificial layers (211-216, FIG. 6B) are removed.

This stage in the process leaves the insulating layers (205) adhered to the charge storage structures 421, with the horizontal openings 711-716 in between. The plurality of sacrificial layers can be removed by an etching process using phosphoric acid (H3PO4) as an etchant. Phosphoric acid (H3PO4) is highly selective to the silicon nitride material used in the sacrificial layers, and to the oxide material used in the insulation layers.

For instance, the horizontal openings in the top opening layer 716 can be used for forming string select lines (SSLs), the horizontal openings in the plurality of intermediate opening layers can be used for forming word lines (WLs), and the horizontal openings in the bottom opening layer 711 can be used for forming ground select lines (GSLs).

Figure 8A:
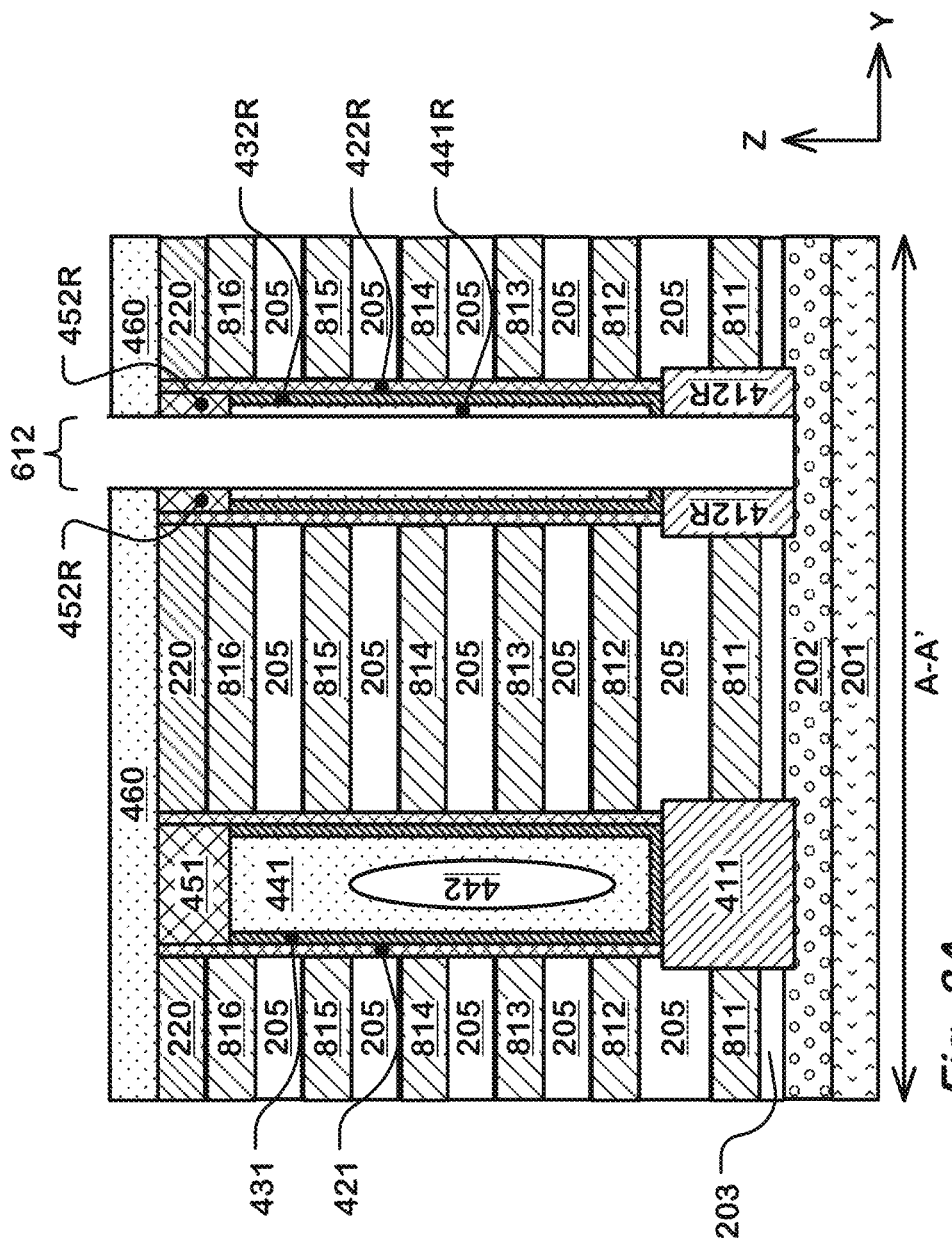
Figure 8B:
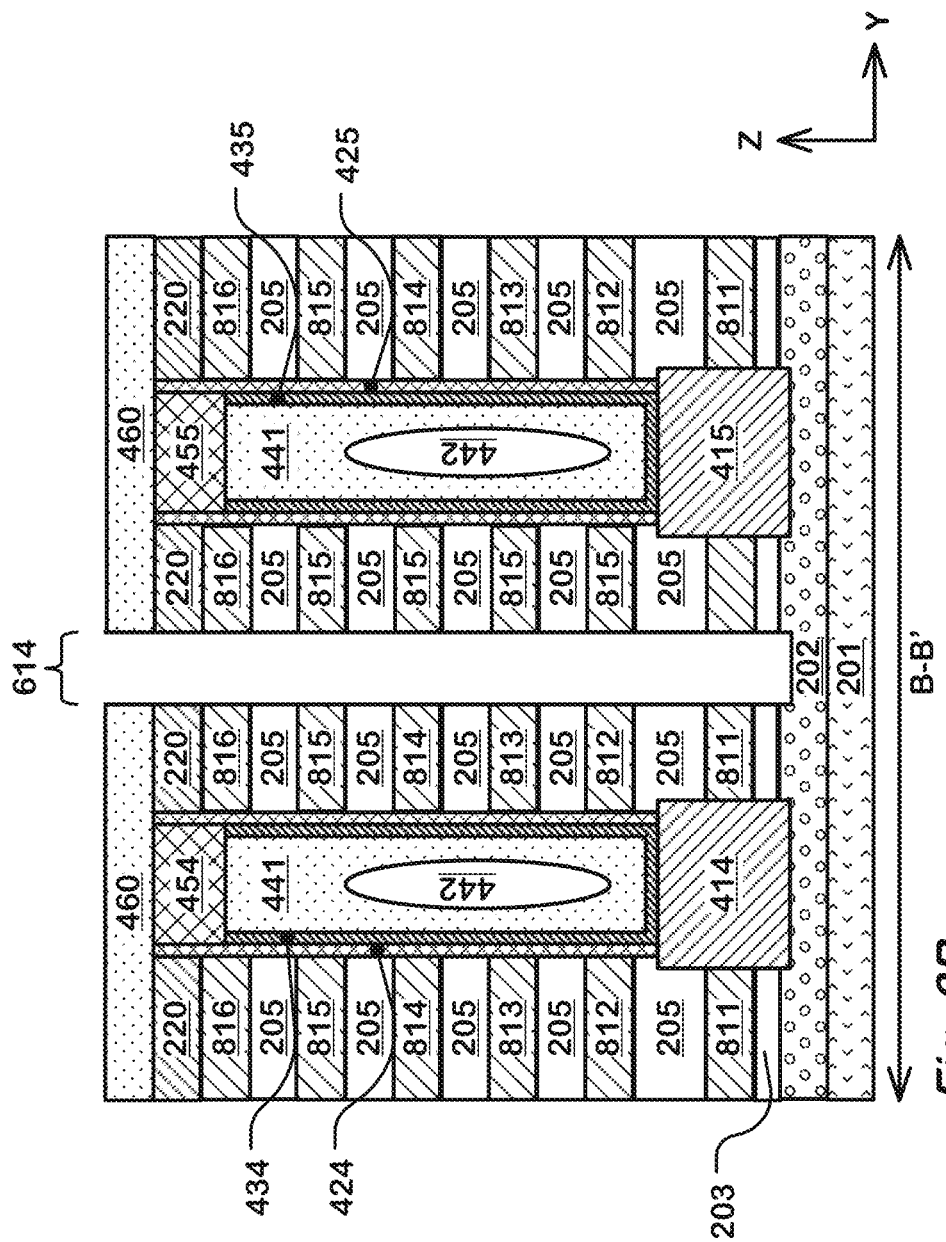

FIGS. 8A and 8B illustrate a stage in the process flow after forming a conductive material in the horizontal openings via the slits (612, FIG. 7A; 614, FIG. 7B) to form a stack of conductive strips (811-816). FIG. 8A illustrates a vertical cross section of the structure, taken along a line A-A' as shown in FIG. 5A, after a conductive material is formed in the horizontal openings. FIG. 8B illustrates a vertical cross section of the structure, taken along a line B-B' as shown in FIG. 5A, after a conductive material is formed in the horizontal openings.

The conductive material can be a N+ or P+ polysilicon material or other conductive material selected for compatibility with the charge storage structures. Other embodiments can include metals, metal nitrides, other metal compounds or combinations of metals and metal compounds, such as platinum, tantalum nitride, metal silicides, aluminum or other metal or metal compound gate materials (e.g. from Ti, TiN, Ta, Ru, Ir, $RuO_2$, $IrO_2$, W, WN), and others. For some applications, it is preferable to use materials having work functions higher than 4 eV, preferably higher than 4.5 eV.

The depositing process may leave excessive conductive material outside the horizontal openings. This stage can include removing the excessive conductive material outside the horizontal openings via the slits, to vertically separate the conductive material in adjacent conductive strips in the stack of conductive strips.

The process flow can further include forming a layer of high-k material e.g. AlOx, HfOx, ZrOx, acting as a blocking layer between the charge storage structures (e.g. 421) and conductive layers in the stack (811-816). For instance, a layer of high-k material can be formed in the horizontal openings (e.g. 711-716), before a conductive material is deposited in the horizontal openings.

Figure 9C:
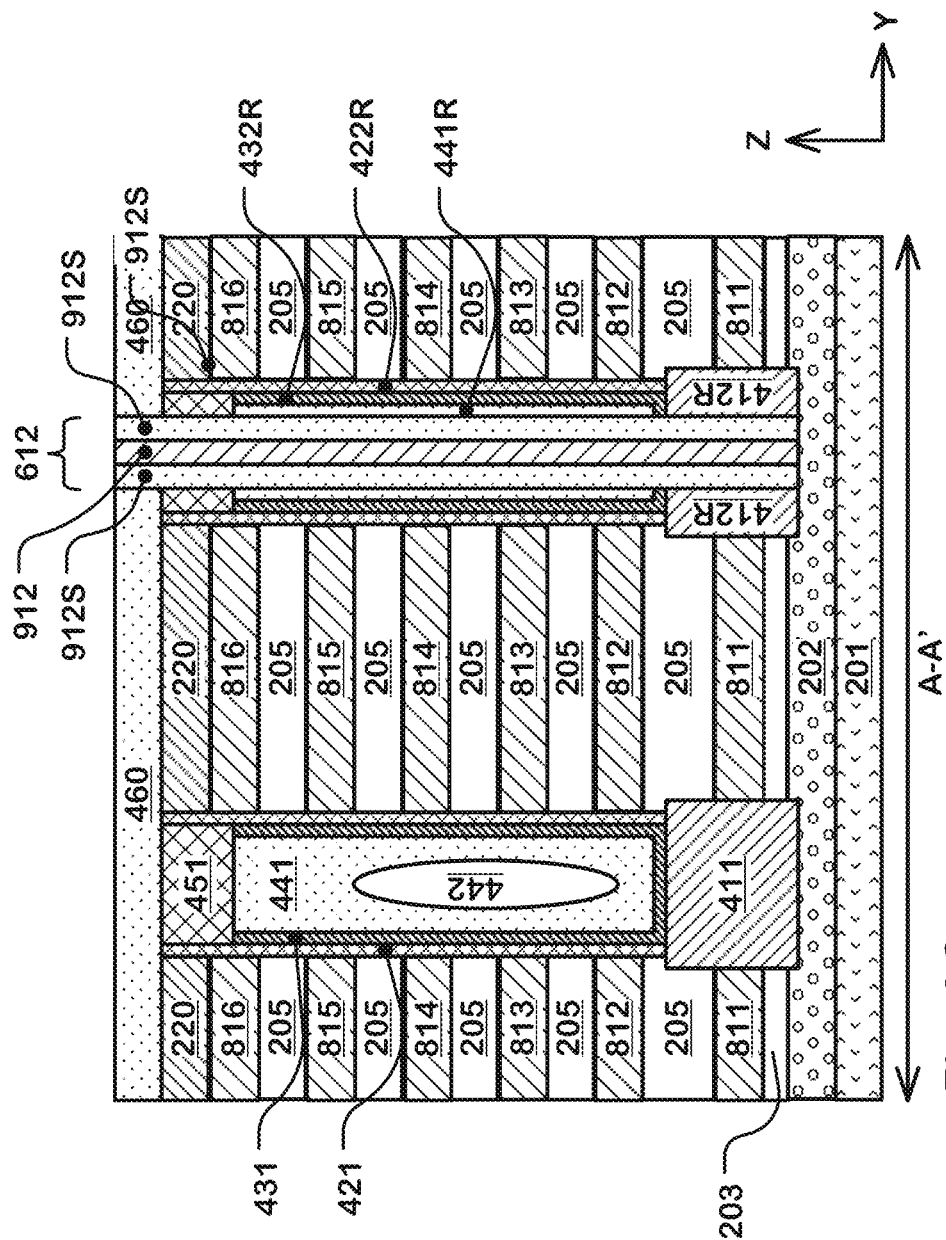
Figure 9D:
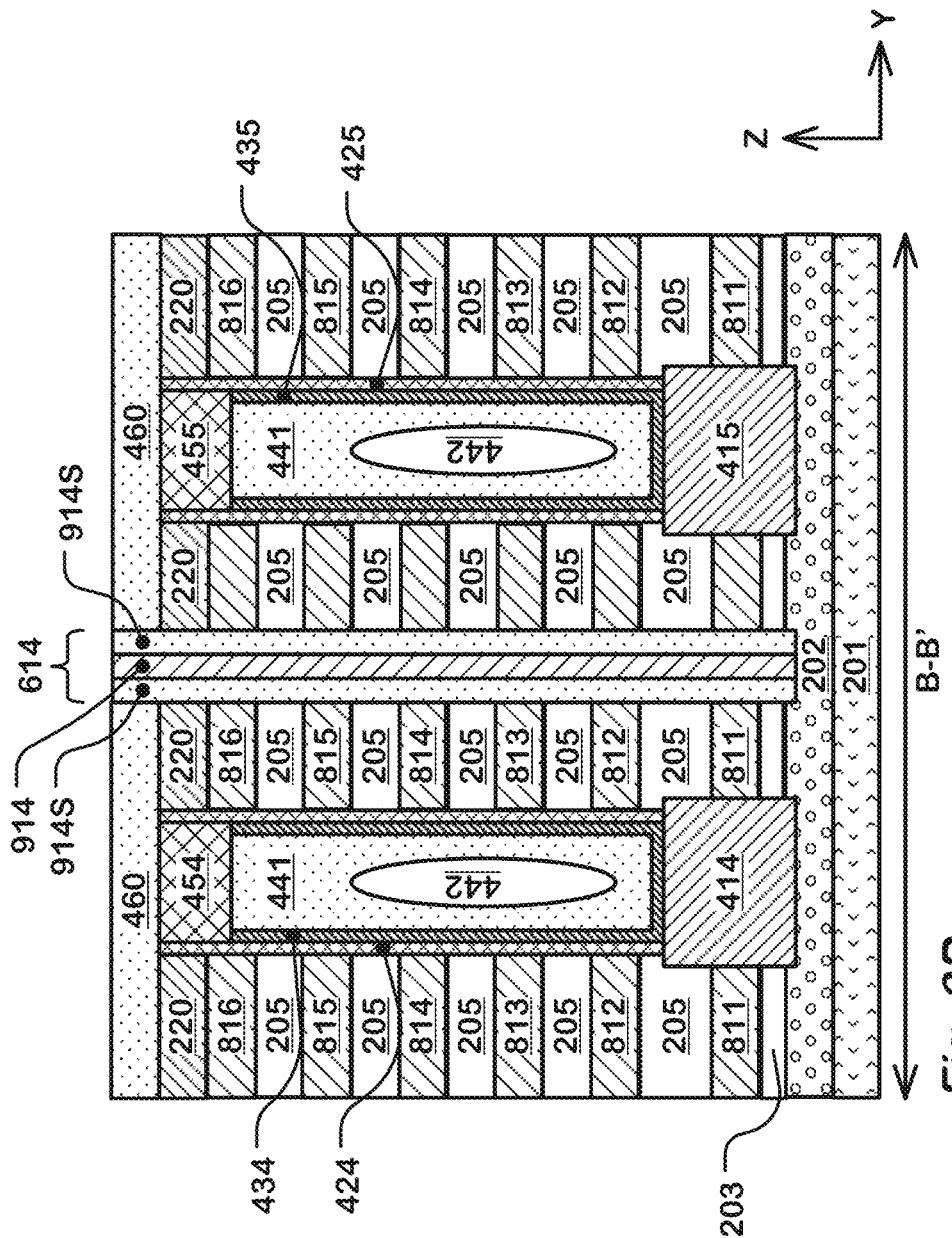

FIGS. 9A, 9B, 9C and 9D illustrate a stage in the process flow after forming an insulating spacer in a slit, and filling the slit with a conductive material over the insulating spacer to form a source line. FIG. 9A illustrates a horizontal cross section of the structure, taken at an upper conductive layer 816 in a stack of conductive layers as shown in FIGS. 9C and 9D. A first source line 912 is disposed vertically through the pillars of a particular row of pillars in the set of rows of pillars. A second source line 914 and a third source line 916 are disposed vertically through the pillars of a second particular row of pillars and a third particular row of pillars in the set of rows of pillars, respectively. The set of rows of pillars includes subsets of rows of pillars (911, 913, 915 and 917) including multiple members disposed between the first source line and the second source line in the second direction (Y-direction) orthogonal to the first direction (X-direction). For instance, a subset of rows of pillars 913 is disposed between the first source line 912 and the second source line 914 in the second direction (Y-direction). Similarly, another subset of rows of pillars 915 is disposed between two source lines 914 and 916 in the second direction (Y-direction). The pillars in the subset of rows of pillars disposed between the first source line 912 and the second source line 914 penetrate through the conductive layers (e.g. 816) in the stack and are surrounded by the conductive layers. An insulating spacer formed in the slits is further described in reference to FIGS. 9B, 9C and 9D.

FIG. 9B illustrates the width of a source line, in reference to an enlarged view of an area 950 in FIG. 9A. As shown in FIG. 9B, the pillars have a first width 941 in the second direction and a source line 912 has a second width 942 in the second direction narrower than the first width. As a result of etching the slit through the pillars of the particular row of pillars, remnants (911R, 913R) of the pillars can remain in the particular row of pillars through which the source line 912 is disposed. An insulating spacer 912S can separate the remnants (911R, 913R) from the source line 912. The insulating spacer 912S can have a third width 943. In one embodiment, the first width 941 of a pillar can be greater than a sum of the second width 942 of a source line plus two times the third width 943 of an insulating spacer. For instance, the first width 941 of a pillar can be 130 nm (nanometer), the second width 942 of a source line can be 30 nm, and the third width 943 of an insulating spacer can be 30 nm.

FIG. 9C illustrates a vertical cross section of the structure, taken along a line A-A' as shown in FIG. 9A, after an insulating spacer 912S is formed in the slit 612, and the slit 612 is filled with a conductive material over the insulating spacer 912S to form a source line 912 in the slit 612. A source line conductor (202, FIG. 9C) is disposed beneath and electrically connected to the first source line 912, the second source line 914 (FIG. 9A), and the subset of rows of pillars (913, FIG. 9A) disposed between the first and second source lines. FIG. 9D illustrates a vertical cross section of the structure, taken along a line B-B' as shown in FIG. 9A, after an insulating spacer 914S is formed in the slit 614, and the slit 614 is filled with a conductive material over the insulating spacer 914S to form a source line 914 in the slit 614.

Figure 10:
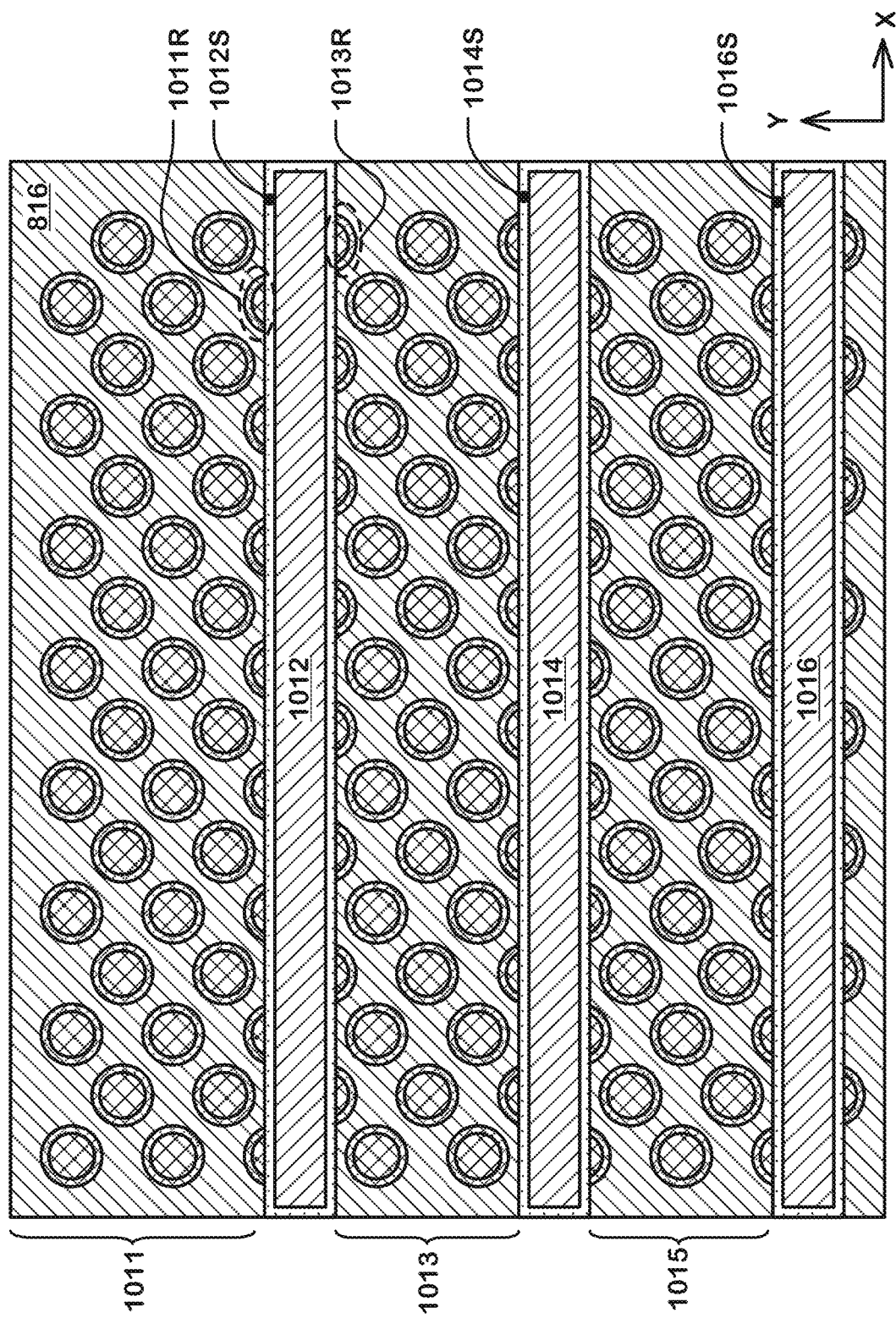
FIG. 10 illustrates a stage in the process flow after forming a source line through pillars at the pillar locations of two adjacent rows of pillars, in an alternative embodiment.

FIG. 10 illustrates a stage in the process flow after forming a source line through pillars at the pillar locations of two adjacent rows of pillars, in an alternative embodiment. FIG. 10 illustrates a horizontal cross section of the structure, taken at an upper conductive layer 816 in a stack of conductive layers as shown in FIGS. 9C and 9D. In this embodiment, a slit can be etched through pillars at the pillar locations of two adjacent rows of pillars, an insulating spacer (1012S, 1014S, 1016S) can be formed in the slit, and the slit can be filled with a conductive material over the insulating spacer to form the source line (1012, 1014, 1016).

A first source line 1012 is disposed vertically through the pillars of a particular row of pillars in the set of rows of pillars. A second source line 1014 and a third source line 1016 are disposed vertically through the pillar of a second particular row of pillars and a third particular row of pillars in the set of rows of pillars, respectively. The set of rows of pillars includes subsets of rows of pillars (1011, 1013, 1015). Each subset of rows of pillars is disposed between a first source line and a second source line in the second direction (Y-direction). For instance, a subset of rows of pillars 1013 is disposed between two source lines 1012 and 1014 in the second direction (Y-direction). Similarly, another subset of rows of pillars 1015 is disposed between two source lines 1014 and 1016 in the second direction (Y-direction).

As a result of etching the slit through the pillars of the two adjacent rows of pillars, remnants (1011R, 1013R) of the pillars can remain at the pillar locations of the two adjacent rows of pillars through which the source line 1012 is disposed. The insulating spacer (1012S) can separate the remnants (1011R, 1013R) and the conductive layers (816) from the source line (1012).

Figure 11:
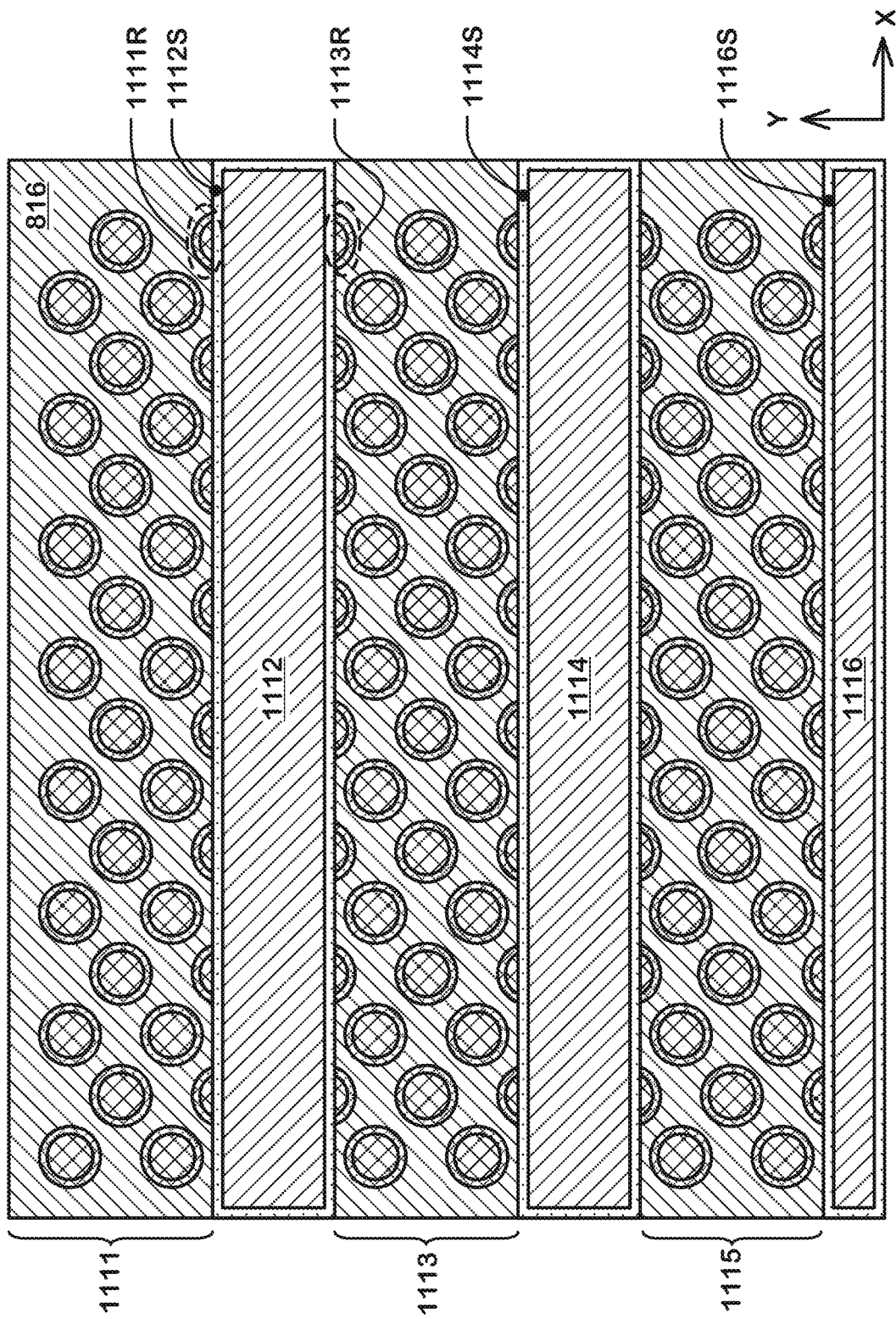
FIG. 11 illustrates a stage in the process flow after forming a source line through pillars at the pillar locations of three adjacent rows of pillars, in a second alternative embodiment.

FIG. 11 illustrates a stage in the process flow after forming a source line through pillars of three adjacent rows of pillars, in a second alternative embodiment. FIG. 11 illustrates a horizontal cross section of the structure, taken at an upper conductive layer 816 in a stack of conductive layers as shown in FIGS. 9C and 9D. In this embodiment, a slit can be etched through pillars of three adjacent rows of pillars, an insulating spacer (1112S, 1114S, 1116S) can be formed in the slit, and the slit can be filled with a conductive material over the insulating spacer to form the source line (1112, 1114, 1116).

A first source line 1112 is disposed vertically through the pillars of a particular row of pillars in the set of rows of pillars. A second source line 1114 and a third source line 1116 are disposed vertically through the pillars of a second particular row of pillars and a third particular row of pillars in the set of rows of pillars, respectively. The set of rows of pillars includes subsets of rows of pillars (1111, 1113, 1115). Each subset of rows of pillars is disposed between a first source line and a second source line in the second direction (Y-direction). For instance, a subset of rows of pillars 1113 is disposed between two source lines 1112 and 1114 in the second direction (Y-direction). Similarly, another subset of rows of pillars 1115 is disposed between two source lines 1114 and 1116 in the second direction (Y-direction).

As a result of etching the slit through the pillars of the two adjacent rows of pillars, remnants (1111R, 1113R) of the pillars in the two adjacent rows of pillars can remain, and the insulating spacer (1112S) can separate the remnants (1111R, 1113R) and the conductive layers (e.g. 816) from the source line (1112).

Figure 12:
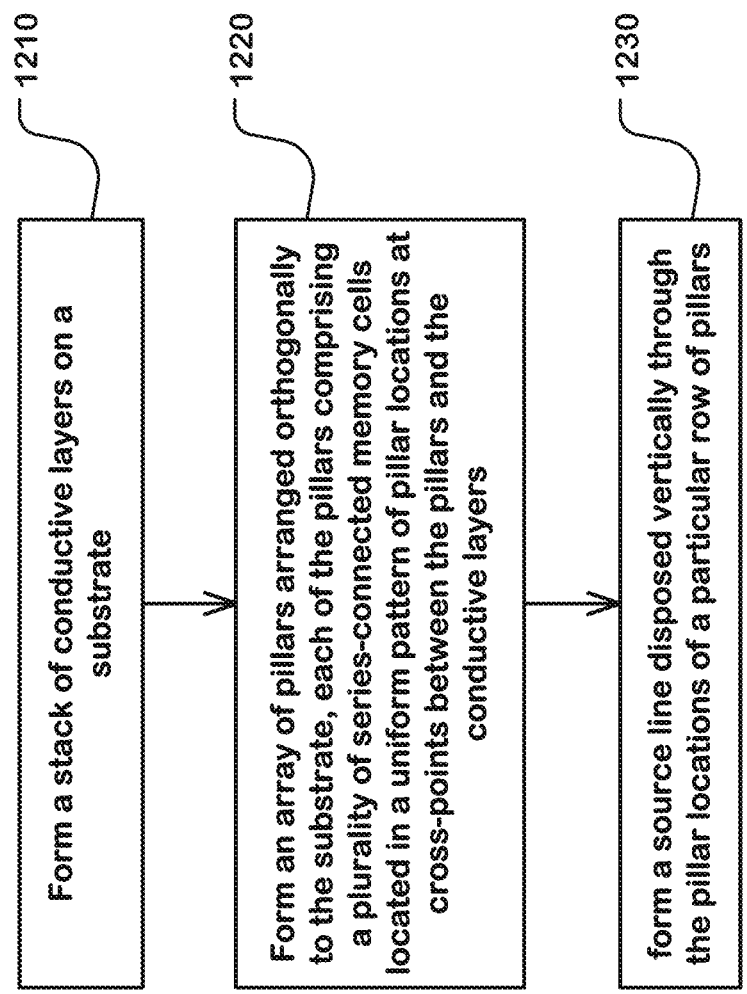
FIG. 12 is an example flowchart illustrating a process for manufacturing a memory device as described herein.

FIG. 12 is an example flowchart illustrating a process for manufacturing a memory device as described herein. At Step 1210, a stack of conductive layers can be formed on a substrate, where each of the layers is oriented parallel to the substrate. This step can include forming a stack of sacrificial layers separated by insulating layers on a substrate as described in reference to FIG. 2, and later replacing the sacrificial layers with a conductive material to form a stack of conductive layers, as described in reference to FIGS. 7A, 7B, 8A and 8B.

At Step 1220, an array of pillars can be formed on the substrate, where the pillars in the array are disposed through the stack. Each of the pillars can comprise a plurality of series-connected memory cells located in a layout pattern of pillar locations at cross-points between the pillars and the conductive layers. The pillars in the array are arranged in a set of rows of pillars extending in a first direction. Forming the array of pillars is further described in reference to FIGS. 4A and 4B.

The layout pattern can have a row pitch (390, FIG. 3A) between pillar locations in a column of pillar locations extending in the second direction (Y-direction) orthogonal to the first direction. The row pitch can be constant for pillar locations in the column including at least a pillar location of the particular row through which the source line is disposed and all pillar locations in the column between the first and second source lines. The layout pattern can have a row offset (391, FIG. 3A) in the second direction between adjacent pillar locations in adjacent columns of pillar locations.

The layout pattern can have a column pitch (380, FIG. 3A) in the first direction (X-direction) between adjacent pillar locations in a row of pillar locations. The layout pattern can have a column offset (381, FIG. 3A) in the first direction between adjacent pillar locations in adjacent rows of pillar locations. The layout pattern is further described in reference to FIG. 3A.

At Step 1230, a source line can be formed vertically through the pillars of a particular row of pillars in the set of rows of pillars. The pillars can have a first width in the second direction and the source line can have a second width in the second direction narrower than the first width. Forming a source line can include etching a slit through the pillars of the particular row of pillars, forming an insulating spacer in the slit, and filling the slit with a conductive material over the insulating spacer in the slit. Etching a slit can leave remnants of the pillars at the pillar locations of the particular row of pillars, the insulating spacer separating the remnants from the source line.

A second source line can be formed vertically through the pillars of a second particular row of pillars in the set of rows of pillars. The set of rows of pillars can include a subset of rows of pillars disposed between the first source line and the second source line in the second direction. Forming source lines is further described in reference to FIGS. 5A, 5B, 5C, 6A, 6B, 9A, 9B, 9C and 9D.

The process can further include forming conductive plugs disposed vertically between vertical channel structures in the array of pillars and the substrate. Etching the slit can comprise etching through the conductive plugs disposed vertically between vertical channel structures in the pillars of the particular row of pillars and the source line conductor, leaving remnants of the conductive plugs at the pillar locations of the particular row of pillars through which the source line is disposed. The insulating spacer can separate the remnants of the conductive plugs from the source line, as described in reference to FIG. 9C.

Figure 13:
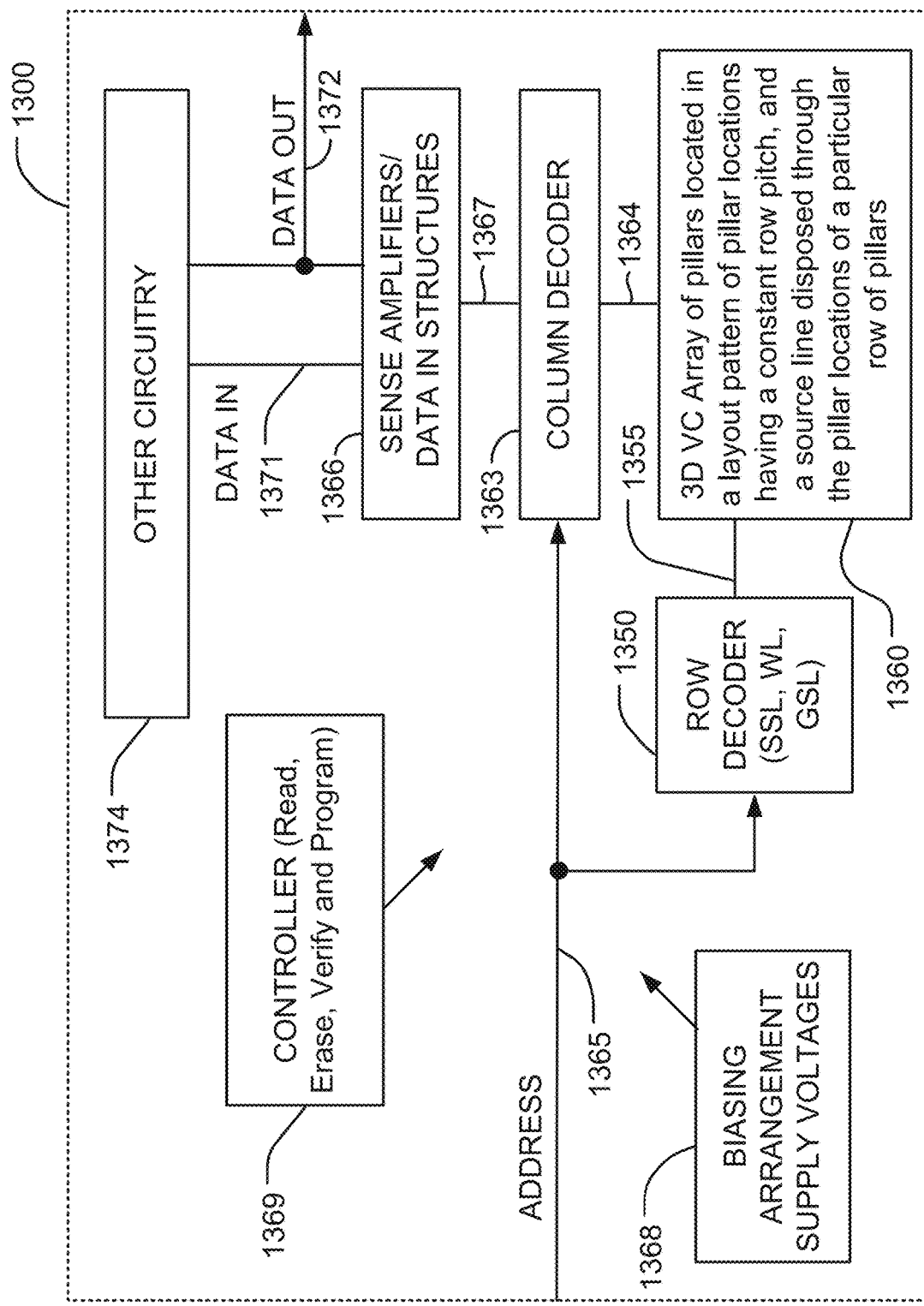
FIG. 13 is a block diagram of an integrated circuit memory in accordance with the present technology.

FIG. 13 is a block diagram of an integrated circuit memory device in accordance with the present technology. In the example shown in FIG. 13, the integrated circuit memory device 1300 includes a 3D (three dimensional) VC (vertical channel) memory array 1360. The memory array 1360 includes a stack of conductive layers on a substrate, and an array of pillars through the stack. Each of the pillars comprises in an example embodiment a plurality of series-connected memory cells located in a layout pattern of pillar locations at cross-points between the pillars and the conductive layers. The pillars in the array are arranged in a set of rows of pillars extending in a first direction.

The layout pattern can have a row pitch (390, FIG. 3A) between pillar locations in a column of pillar locations extending in the second direction (Y-direction) orthogonal to the first direction. The row pitch can be constant for pillar locations in the column including at least a pillar location of the particular row through which the source line is disposed and all pillar locations in the column between the first and second source lines. The layout pattern can have a row offset (391, FIG. 3A) in the second direction between adjacent pillar locations in adjacent columns of pillar locations.

The layout pattern can have a column pitch (380, FIG. 3A) in the first direction (X-direction) between adjacent pillar locations in a row of pillar locations. The layout pattern can have a column offset (381, FIG. 3A) in the first direction between adjacent pillar locations in adjacent rows of pillar locations.

A first source line is disposed vertically through the pillars of a particular row of pillars in the set of rows of pillars. A second source line is disposed vertically through the pillars of a second particular row of pillars in the set of rows of pillars, wherein the set of rows of pillars includes a subset of rows of pillars disposed between the first source line and the second source line in the second direction. In one embodiment, the pillars have a first width in the second direction and the source line has a second width in the second direction narrower than the first width.

Remnants of the pillars can be disposed at the pillar locations of the particular row of pillars through which the source line is disposed. An insulating spacer can separate the remnants from the source line.

A row decoder 1350 is coupled to a plurality of lines 1355 including string select lines SSL, word lines WL, and ground select lines GSL, and arranged along rows in the memory array 1360. A column decoder 1363 is coupled to a plurality of bit lines 1364 arranged along columns in the memory array 1360 for reading and programming data from the memory cells in the memory array 1360. Addresses are supplied on bus 1365 to column decoder 1363 and row decoder 1361. Sense amplifiers and data-in structures in block 1366 are coupled to the column decoder 1363 in this example via data bus 1367. Data is supplied via the data-in line 1371 from input/output ports on the integrated circuit 1300 or from other data sources internal or external to the integrated circuit 1300, to the data-in structures in block 1366. In the illustrated embodiment, other circuitry 1374 is included on the integrated circuit, such as a general purpose processor or special purpose application circuitry, or a combination of modules providing system-on-a-chip functionality supported by the programmable resistance cell array. Data is supplied via the data-out line 1372 from the sense amplifiers in block 1366 to input/output ports on the integrated circuit 1300, or to other data destinations internal or external to the integrated circuit 1300.

A controller 1369 implemented in this example using bias arrangement state machine controls the application of bias arrangement supply voltage generated or provided through the voltage supply or supplies in block 1368, such as read, verify, program and erase voltages. Controller 1369 can be configured to execute a program operation on memory cells in the memory array 1360.

The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A manufacturing method, comprising:
   forming a stack of conductive layers;
   forming an array of pillars through the stack, each of the pillars comprising a plurality of series-connected memory cells located in a layout pattern of pillar locations at cross-points between the pillars and the conductive layers, the pillars in the array being arranged in a set of rows of pillars extending in a first direction; and forming a first source line disposed vertically through the pillars a first particular row of pillars in the set of rows of pillars;

forming a second source line disposed vertically through the pillars of a second particular row of pillars in the set of rows of pillars, wherein the set of rows of pillars includes a subset of rows of pillars including multiple members disposed between the first source line and the second source line; and forming a source line conductor disposed beneath and electrically connected to the first source line, the second source line, and the subset of rows of pillars disposed between the first and second source lines.

2. The method of claim 1, wherein the layout pattern has a row pitch between pillar locations in a column of pillar locations extending in a second direction orthogonal to the first direction, the row pitch being constant for pillar locations in the column including at least a pillar location of the first particular row through which the first source line is disposed and all pillar locations in the column between the first and second source lines.

3. The method of claim 1, wherein the pillars in the subset of rows of pillars penetrate through the conductive layers in the stack and are surrounded by the conductive layers.

4. The method of claim 1, wherein the layout pattern has a row offset in the second direction between adjacent pillar locations in adjacent columns of pillar locations.

5. The method of claim 1, wherein the layout pattern has a column pitch in the first direction between adjacent pillar locations in a row of pillar locations, and has a column offset in the first direction between adjacent pillar locations in adjacent rows of pillar locations.

6. The method of claim 1, wherein the pillars have a first width in the second direction and the first source line has a second width in the second direction narrower than the first width.

7. The method of claim 1, said forming the first source line comprising:
   etching a slit through the pillars of the first particular row of pillars;
   forming an insulating spacer in the slit; and
   filling the slit with a conductive material over the insulating spacer in the slit.

8. The method of claim 7, said etching the slit leaving remnants of the pillars at the pillar locations of the first particular row of pillars, the insulating spacer separating the remnants from the first source line.

9. The method of claim 7, comprising:
   forming conductive plugs disposed vertically between vertical channel structures in the array of pillars and the source line conductor, wherein the source line conductor is connected to the first source line; and
   said etching the slit comprising etching through the conductive plugs disposed vertically between vertical channel structures in the pillars of the first particular row of pillars and the source line conductor, leaving remnants of the conductive plugs at the pillar locations of the first particular row of pillars through which the first source line is disposed,
   the insulating spacer separating the remnants of the conductive plugs from the first source line.

10. The method of claim 1, said forming the first source line comprising:
   etching a slit through the pillars of at least two adjacent rows of pillars in the set of rows of pillars including the first particular row of pillars;
   forming an insulating spacer in the slit; and
   filling the slit with a conductive material over the insulating spacer in the slit.

* * * * *